US009075084B2

(12) United States Patent
Hackemack et al.

(10) Patent No.: US 9,075,084 B2
(45) Date of Patent: Jul. 7, 2015

(54) TEST AND CONNECTION APPARATUS ARRANGEMENT, AND TEST APPARATUS

(75) Inventors: Frank Hackemack, Detmold (DE); Joerg Richts, Schlangen (DE); Bernhard Jaschke, Lage (DE)

(73) Assignee: WEIDMUELLER INTERFACE GMBH & CO. KG, Detmold (DE)

( * ) Notice: Subject to any disclaimer, the term of this patent is extended or adjusted under 35 U.S.C. 154(b) by 98 days.

(21) Appl. No.: 14/123,212

(22) PCT Filed: May 21, 2012

(86) PCT No.: PCT/EP2012/059392
§ 371 (c)(1),
(2), (4) Date: Nov. 30, 2013

(87) PCT Pub. No.: WO2012/163716
PCT Pub. Date: Dec. 6, 2012

(65) Prior Publication Data
US 2014/0097855 A1    Apr. 10, 2014

(30) Foreign Application Priority Data
Jun. 3, 2011    (DE) .................... 20 2011 101 414 U

(51) Int. Cl.
| H01H 31/02 | (2006.01) |
| G01R 1/04 | (2006.01) |
| H01R 9/26 | (2006.01) |
| G01R 1/073 | (2006.01) |
| G01R 31/02 | (2006.01) |
| G01R 31/327 | (2006.01) |

(52) U.S. Cl.
CPC .............. *G01R 1/0416* (2013.01); *G01R 1/04* (2013.01); *H01R 9/2666* (2013.01); *G01R 1/07307* (2013.01)

(58) Field of Classification Search
CPC ...... H01R 9/2666; G01R 1/04; G01R 1/0416; G01R 1/07307; G01R 31/025; G01R 31/021; G01R 31/31926; H01L 21/67103; H01L 21/67173
USPC .......................................... 324/415, 500, 555
See application file for complete search history.

(56) References Cited

U.S. PATENT DOCUMENTS

| 4,676,568 A * | 6/1987 | Nault et al. ................... 439/169 |
| 2008/0106266 A1 * | 5/2008 | Diessel ......................... 324/415 |
| 2012/0094535 A1 * | 4/2012 | Zhang ..................... 439/607.01 |

FOREIGN PATENT DOCUMENTS

| CH | 663 493 A5 | 12/1987 |
| DE | 197 09 054 C1 | 7/1998 |

(Continued)

*Primary Examiner* — Tung X Nguyen
*Assistant Examiner* — Raul Rios Russo
(74) *Attorney, Agent, or Firm* — Lawrence E. Laubscher, Sr.; Lawrence E. Laubscher, Jr.; Robert D. Spendlove

(57) ABSTRACT

A testing arrangement for testing the electrical circuits of a terminal block assembly, comprising a generally rectangular testing unit housing formed of insulating material and containing a chamber, at least one connection device mounted in chamber and having an elongated connector body formed of insulating material and including center and end portions. An integral measuring tab portion extends downwardly from the body center portion for insertion into a testing opening contained in the terminal block assembly, and a pair of coplanar measurement portions extend upwardly from the connector body ends and terminating at different elevations, thereby to afford a compact testing arrangement. Two electrical circuit connecting portions are mounted on the connector body, each including an input conductive contact plate mounted on one side of said measuring tab portion, and an output contact mounted within one of said measurement portions for connection with one end of a testing component.

15 Claims, 30 Drawing Sheets

(56) References Cited

FOREIGN PATENT DOCUMENTS

| DE | 10 2004 040 859 A1 | 3/2006 |
| DE | 10 2004 040 859 B4 | 3/2007 |
| DE | 10 2006 052 894 A1 | 5/2008 |
| EP | 1921715 A3 | 5/2008 |

* cited by examiner

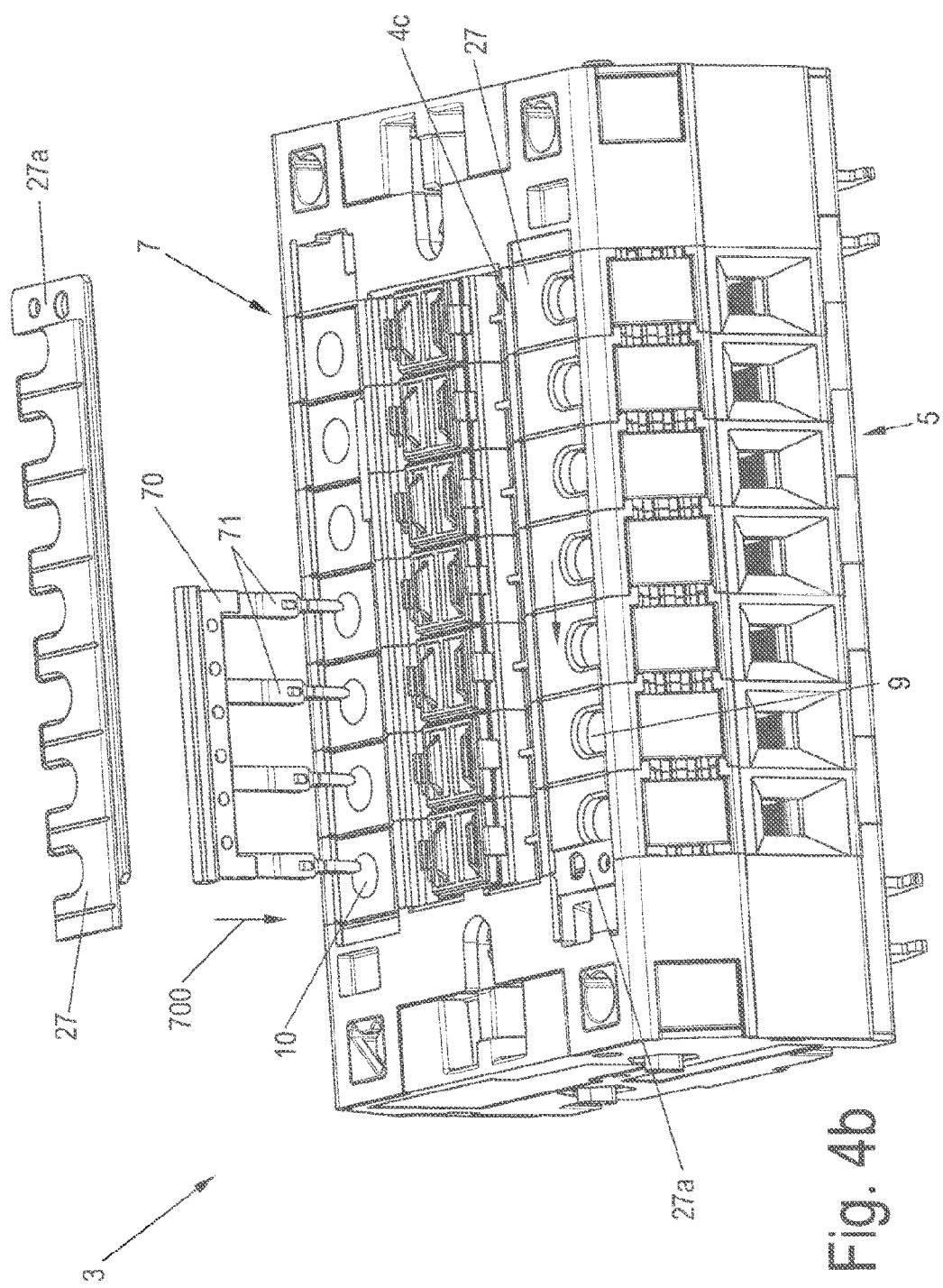

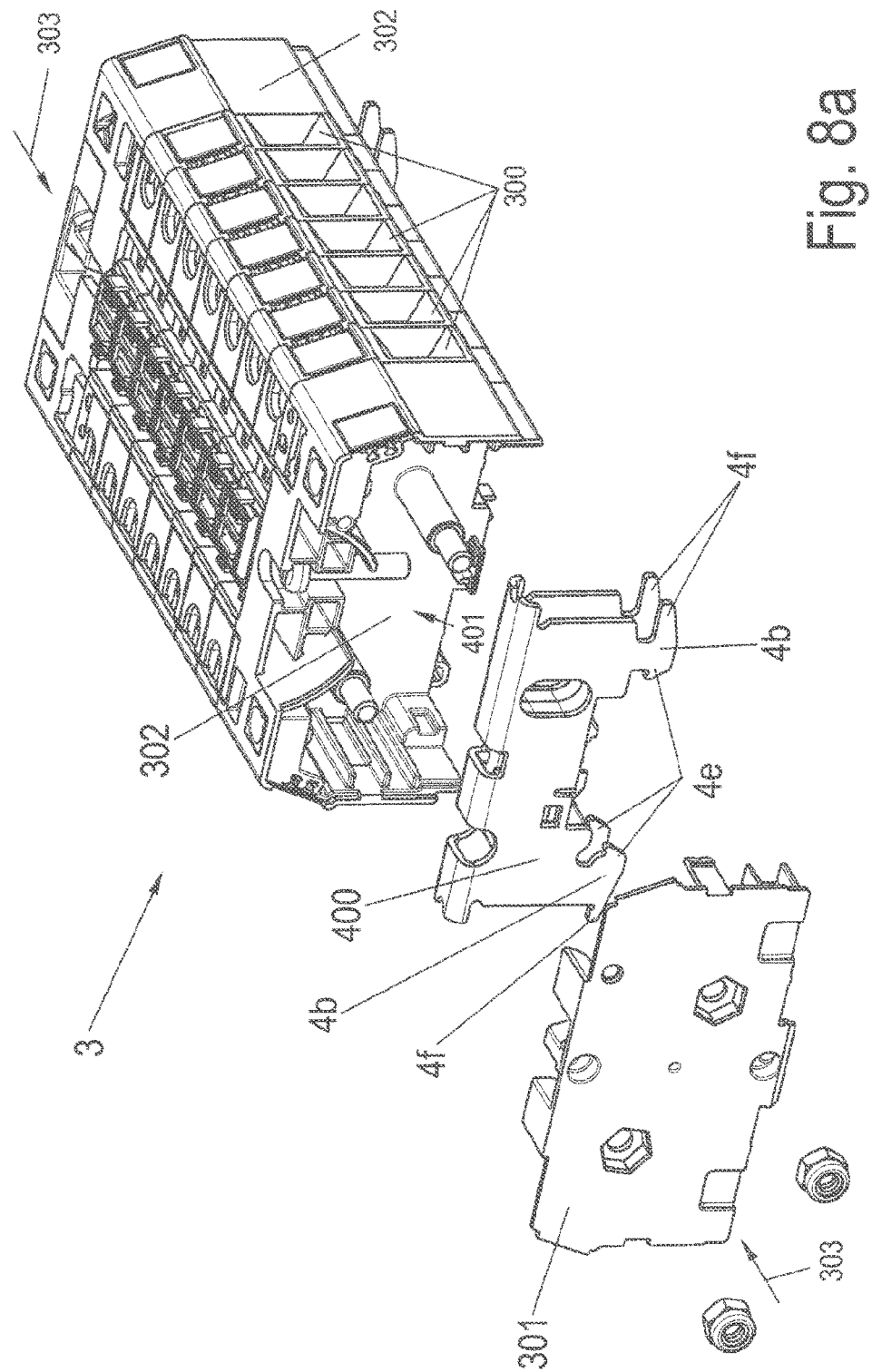

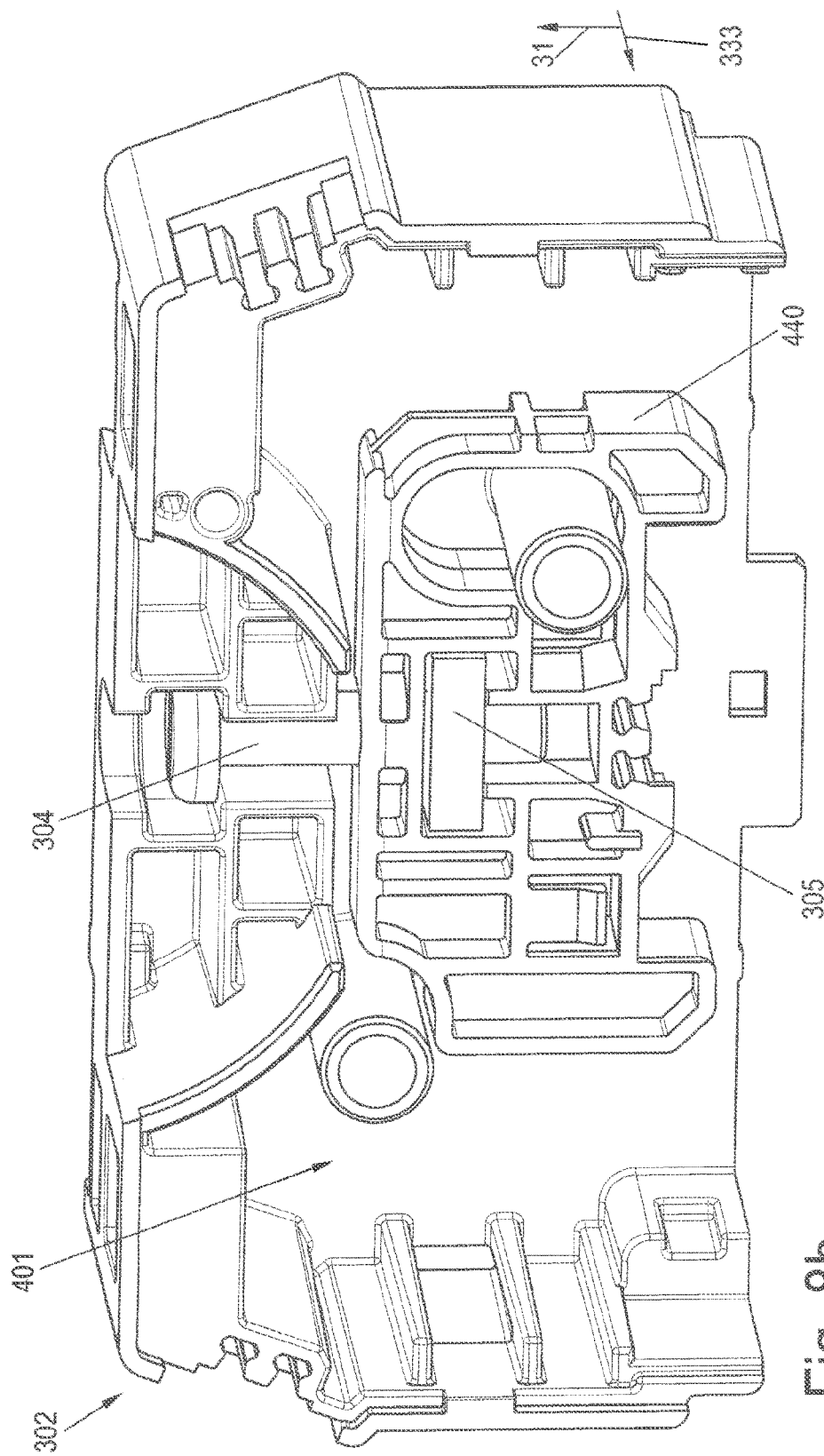

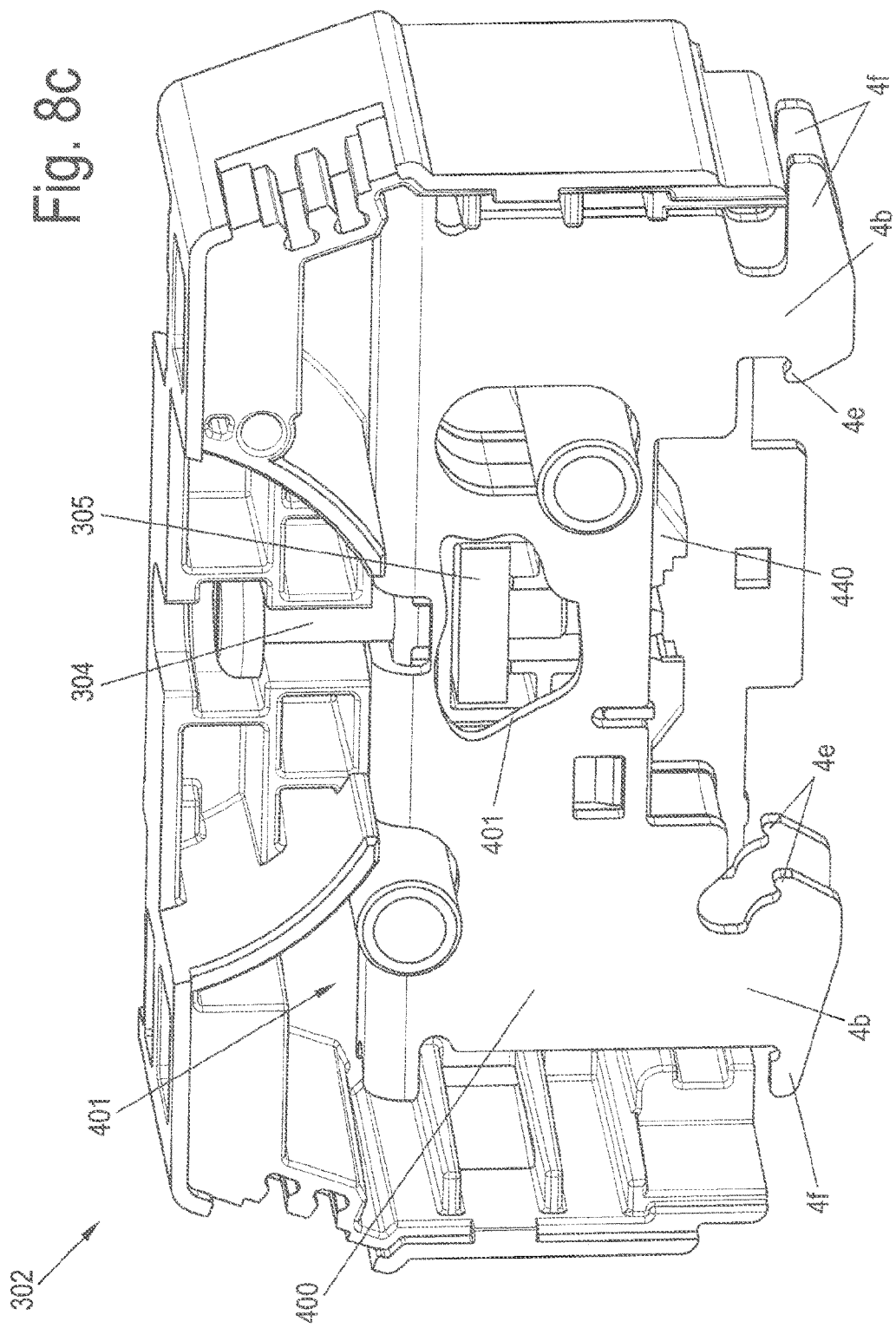

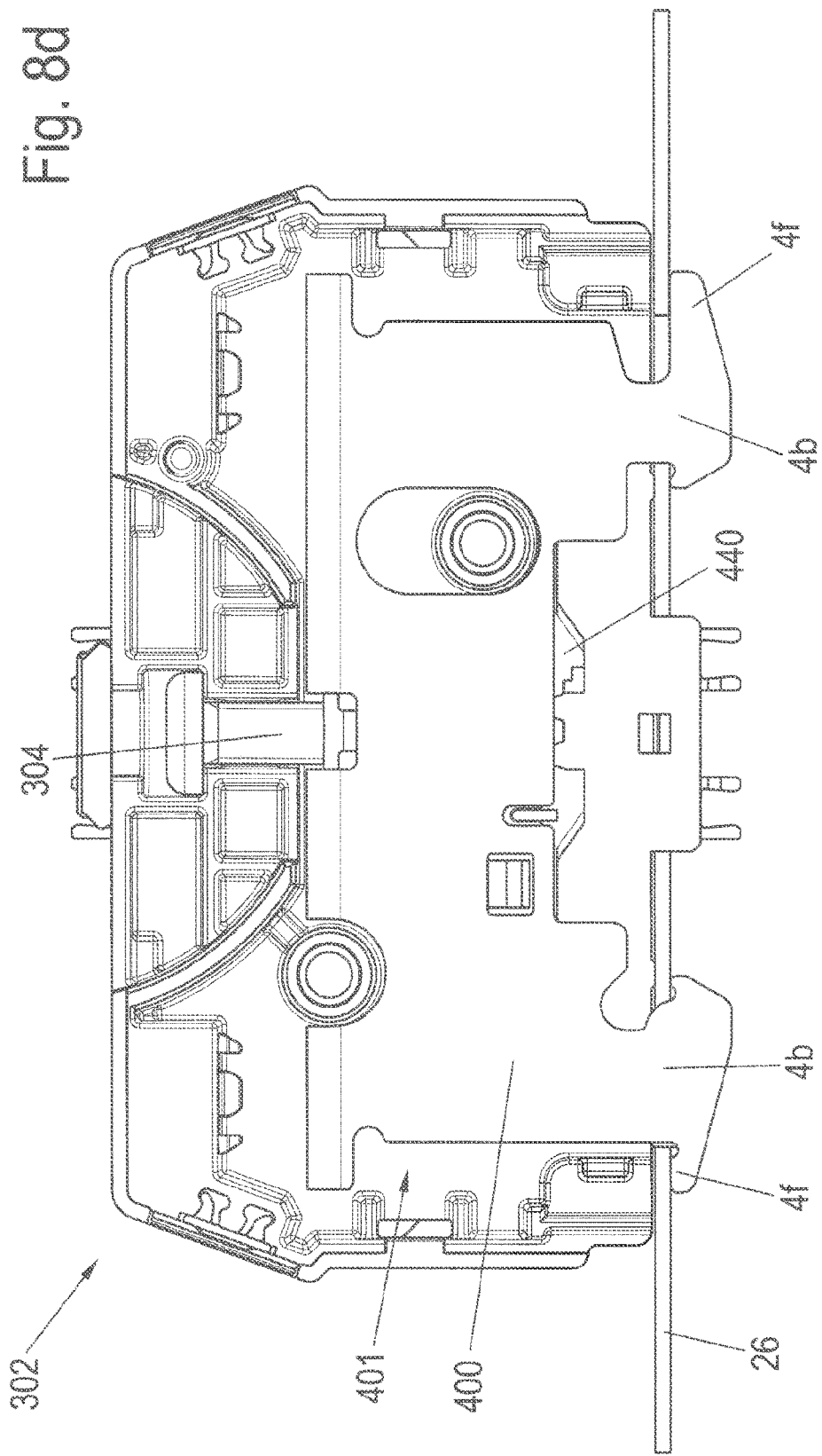

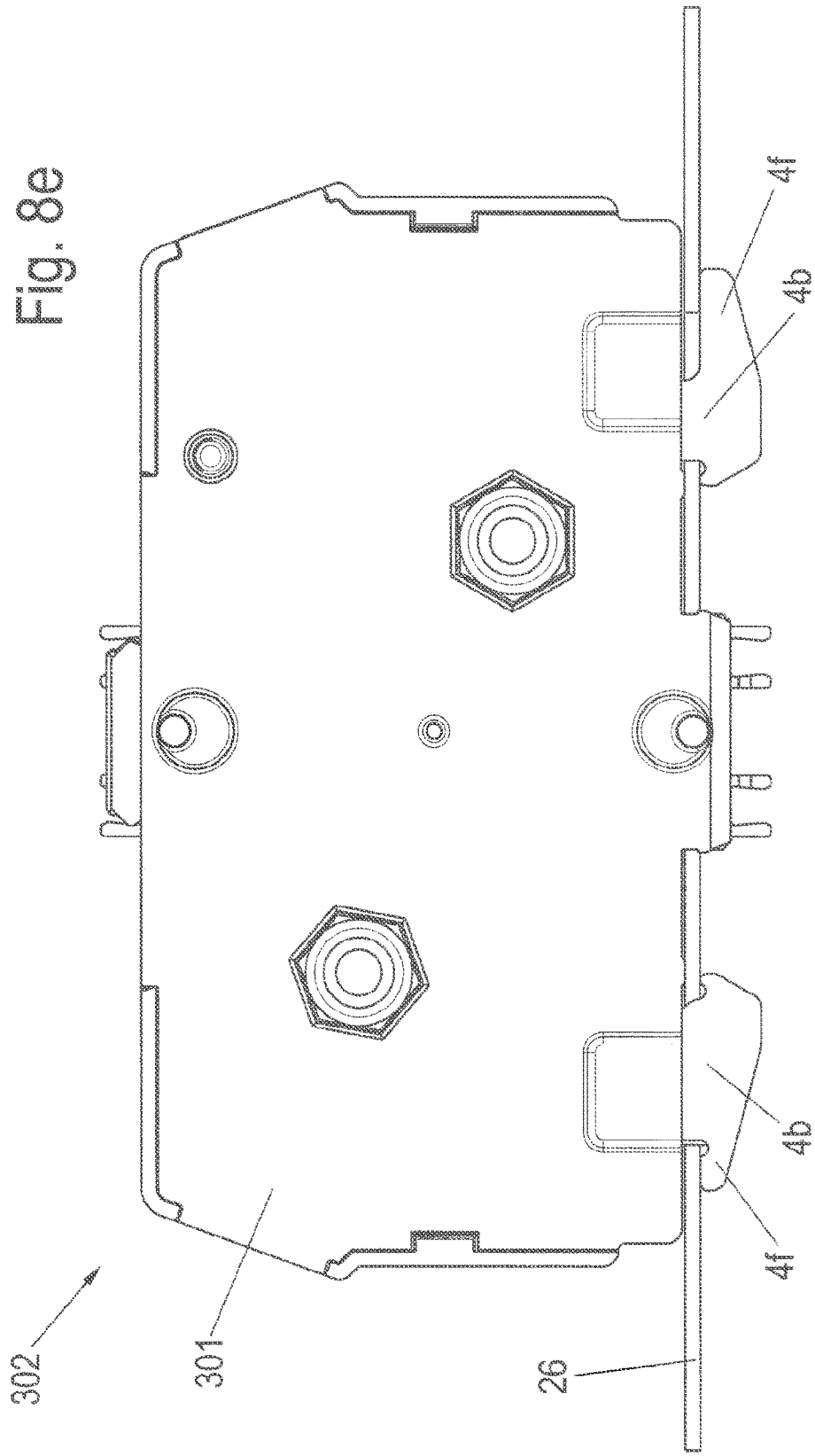

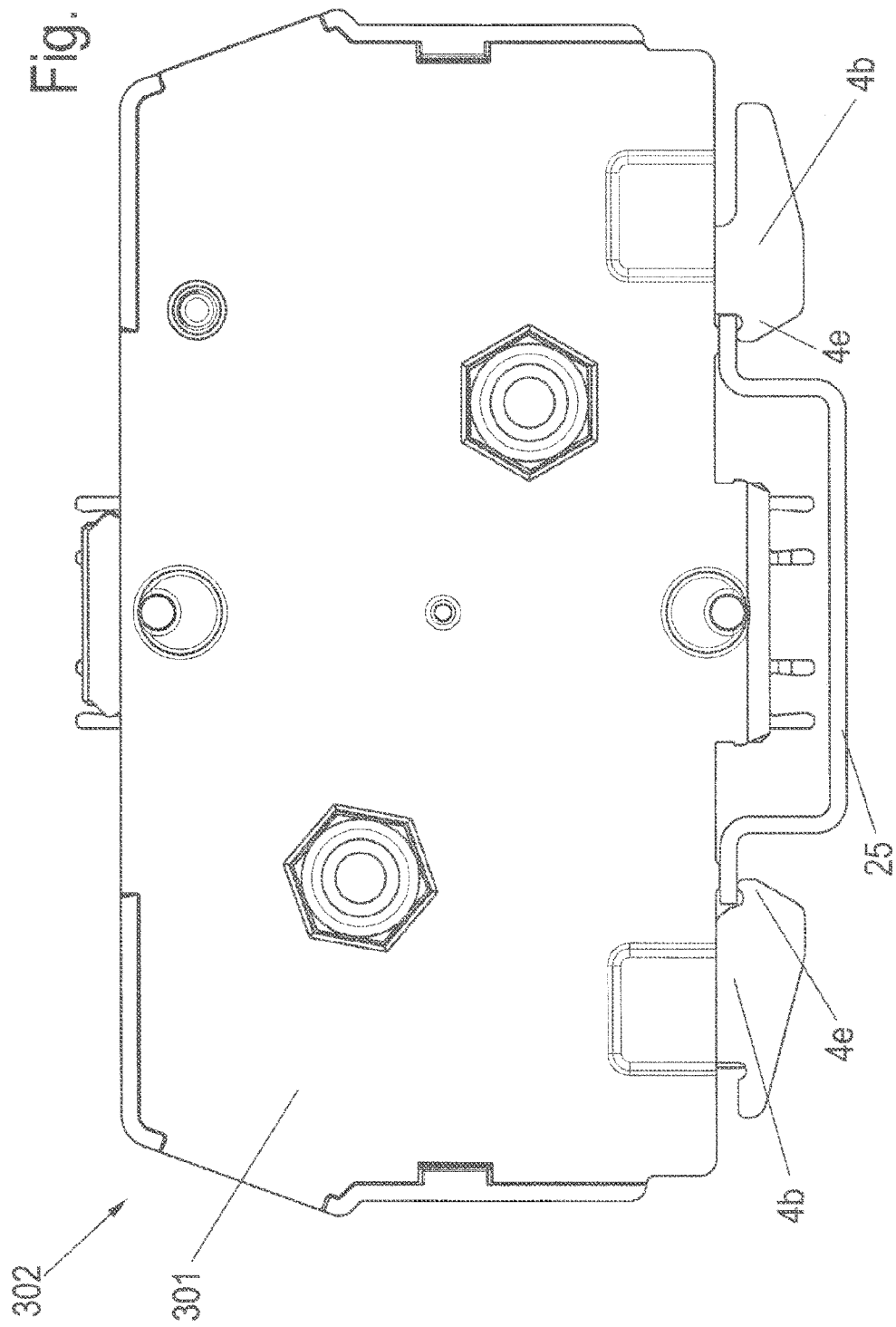

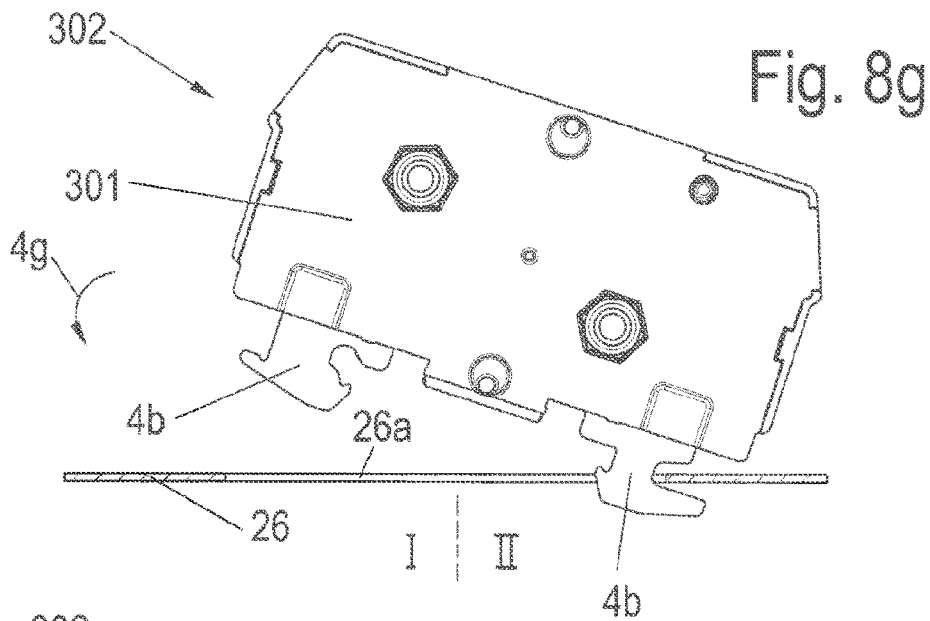
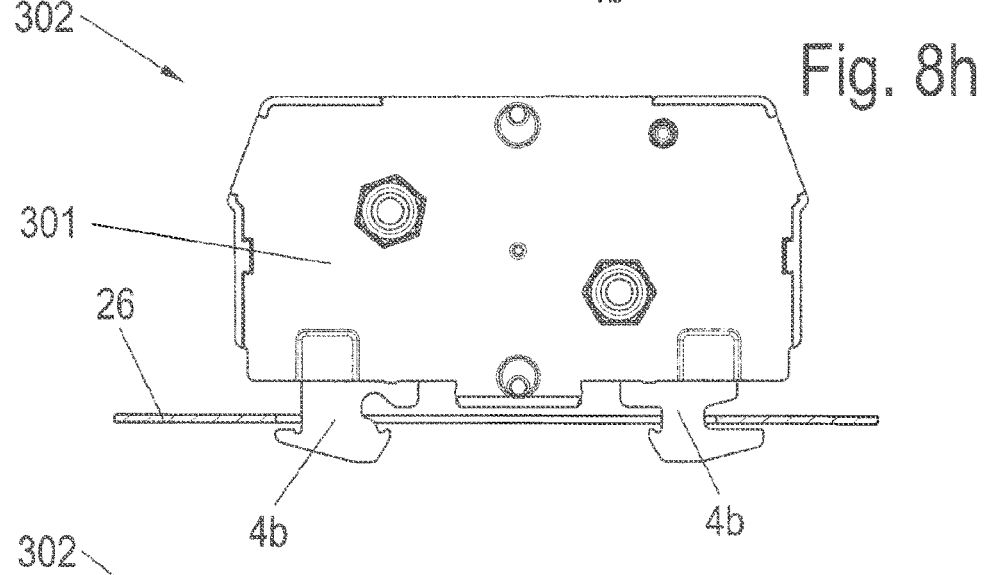
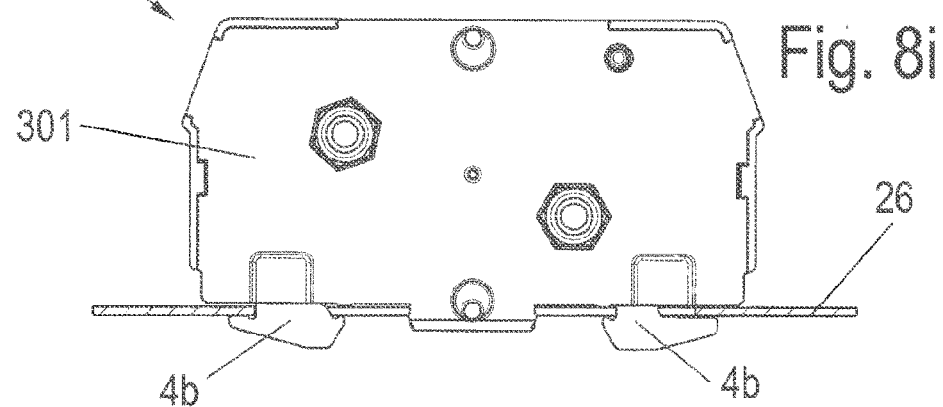

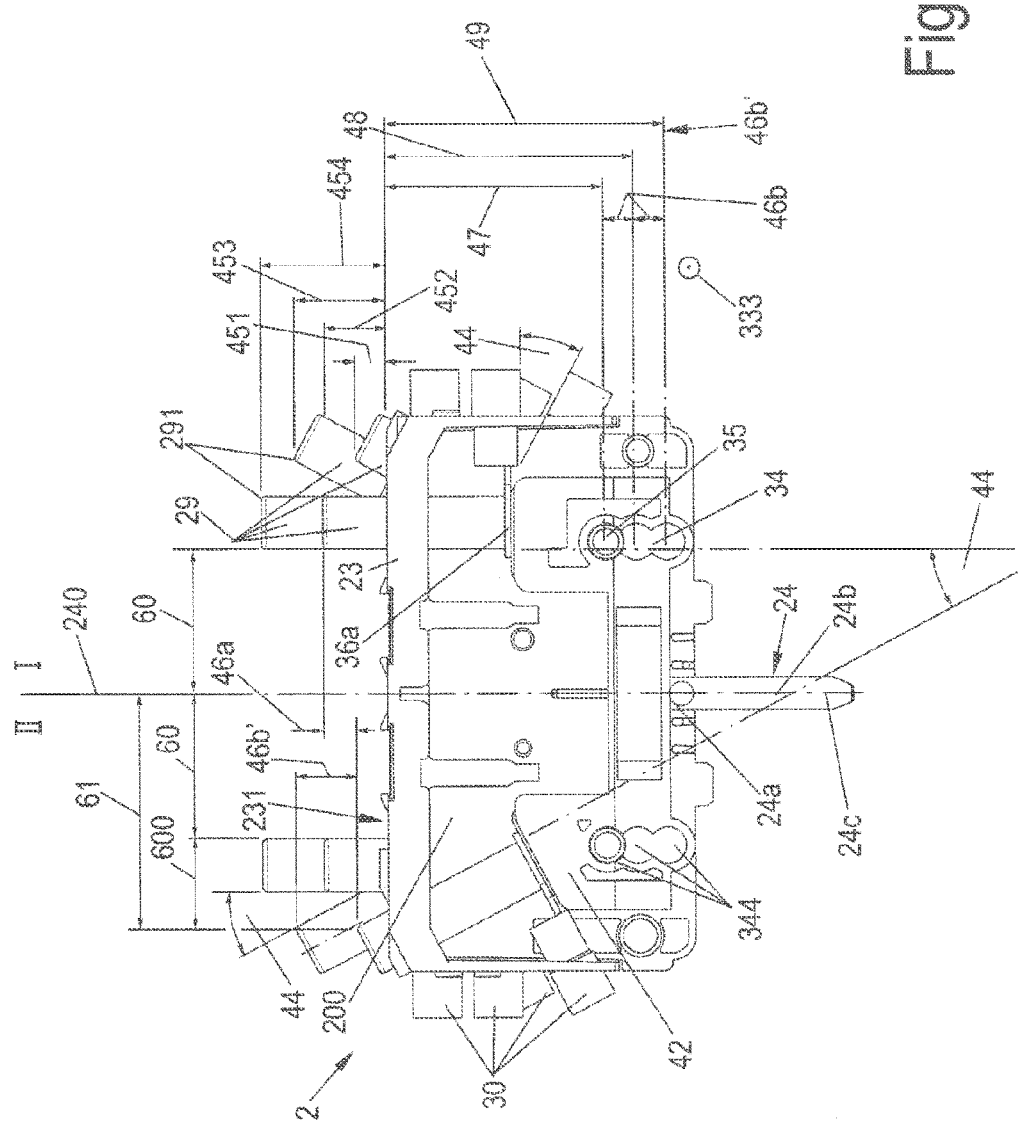

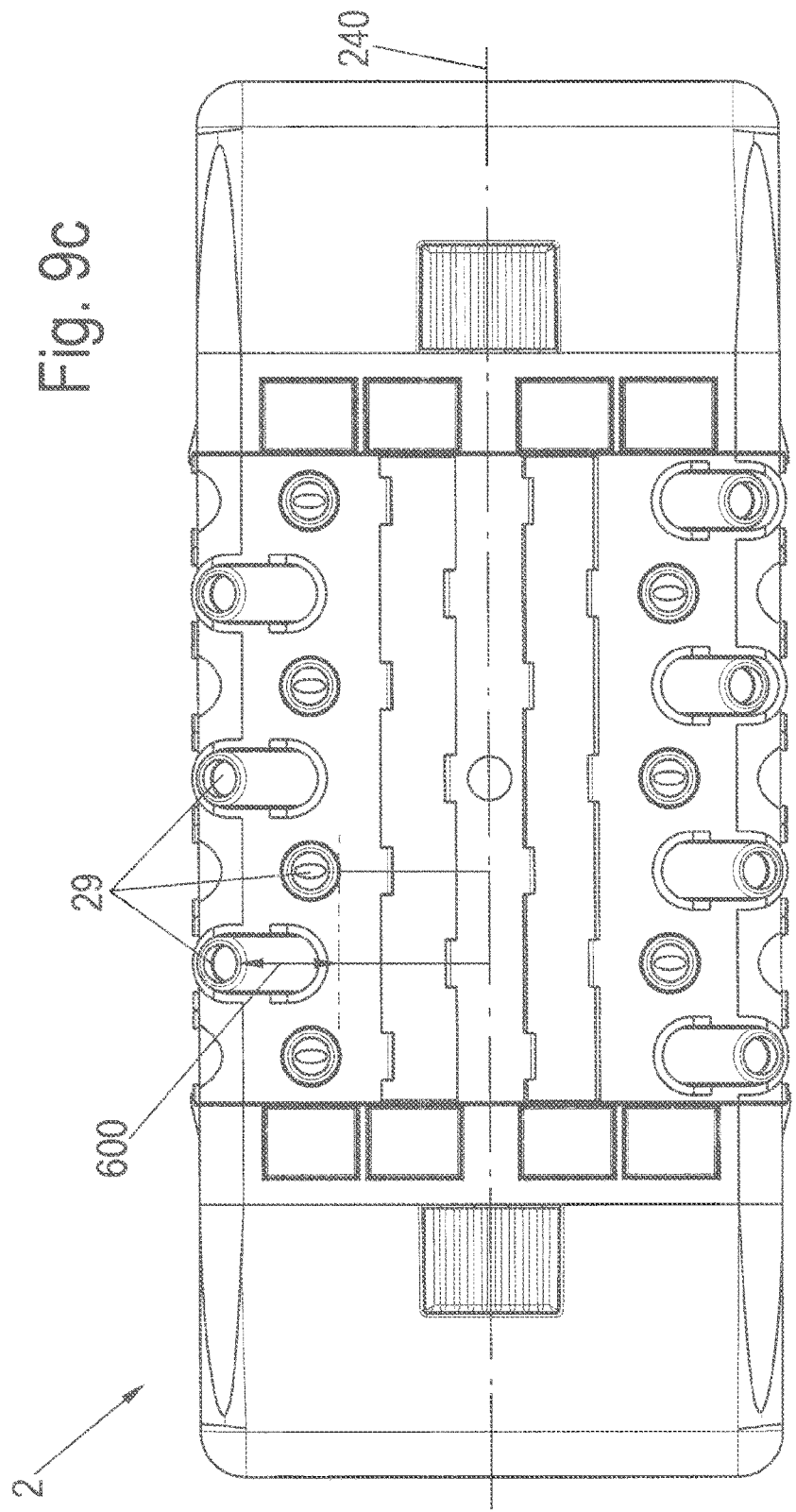

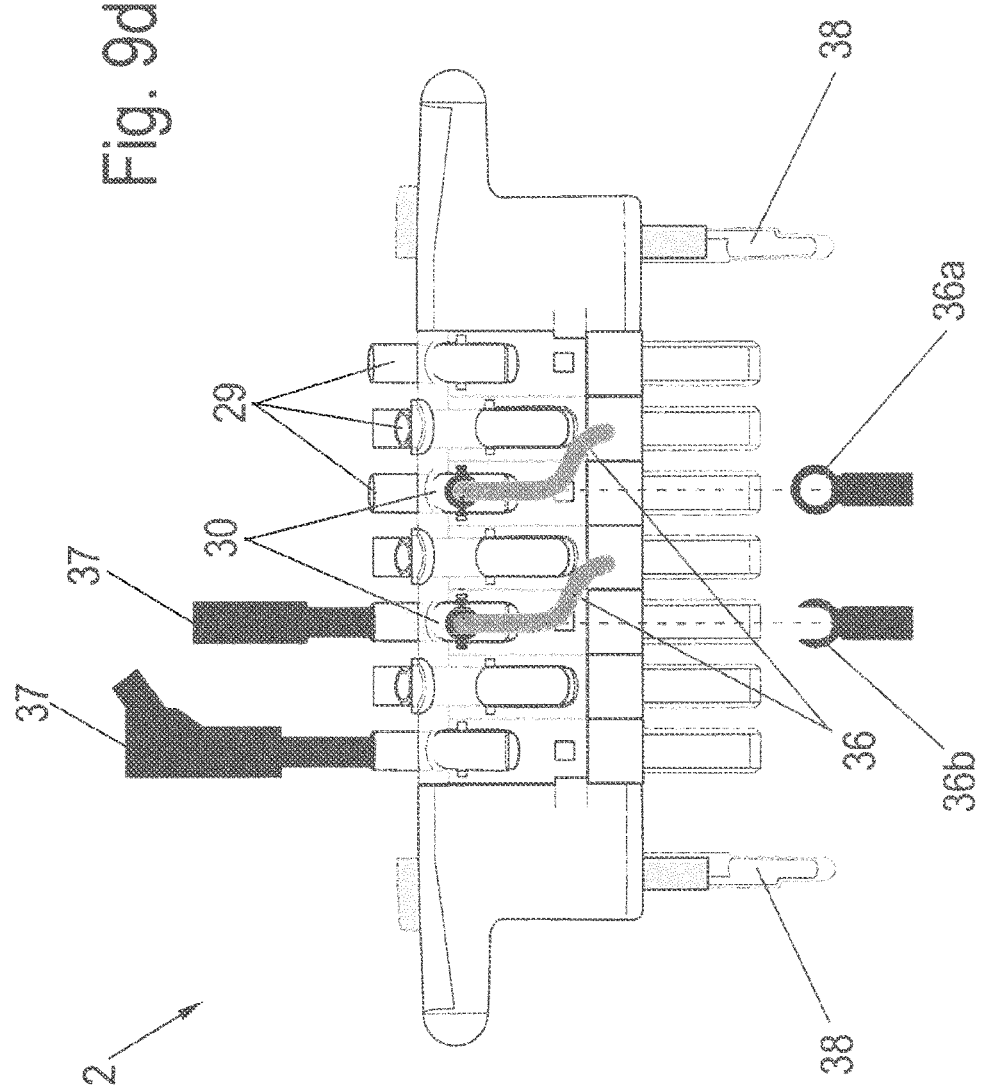

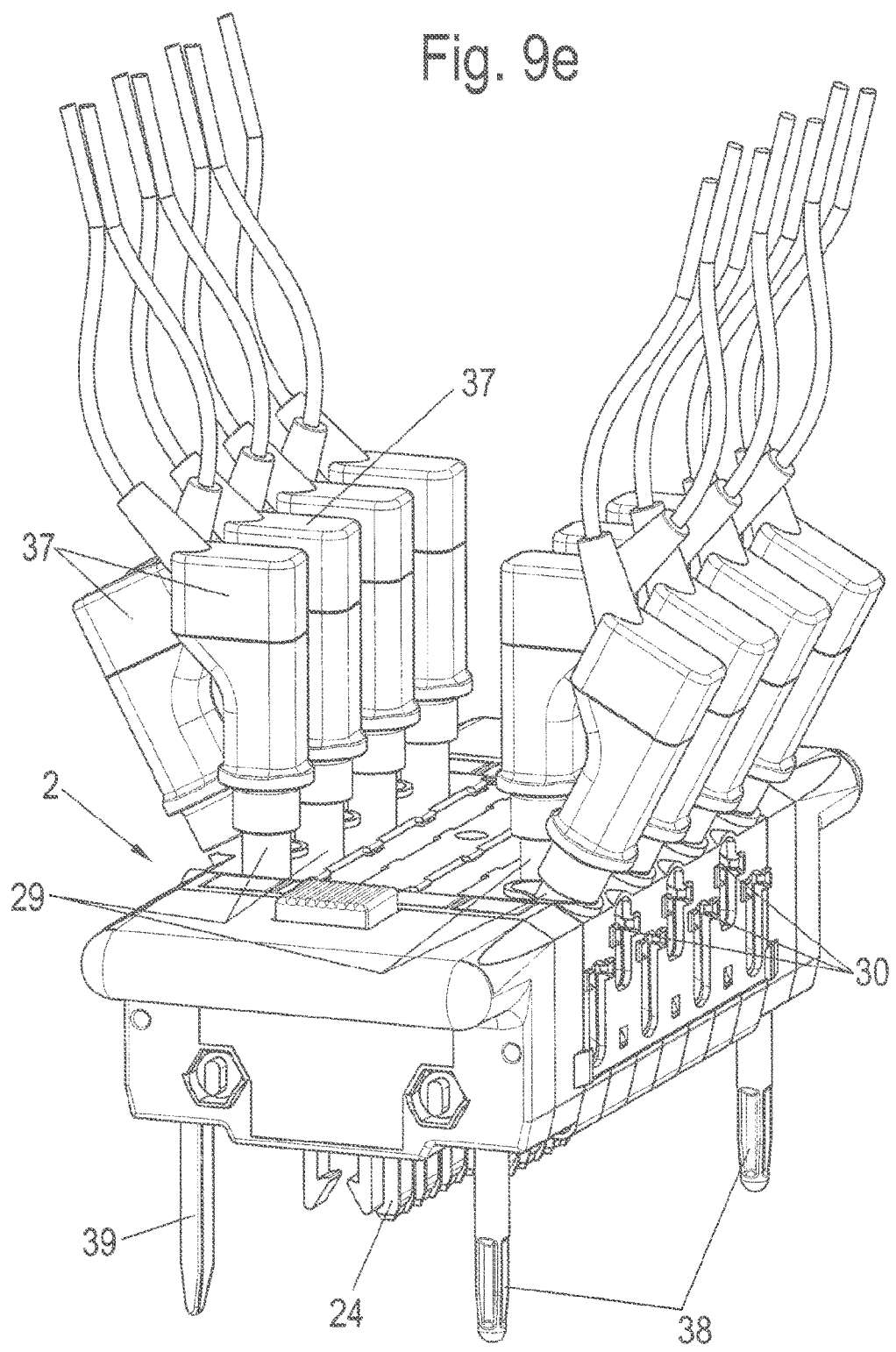

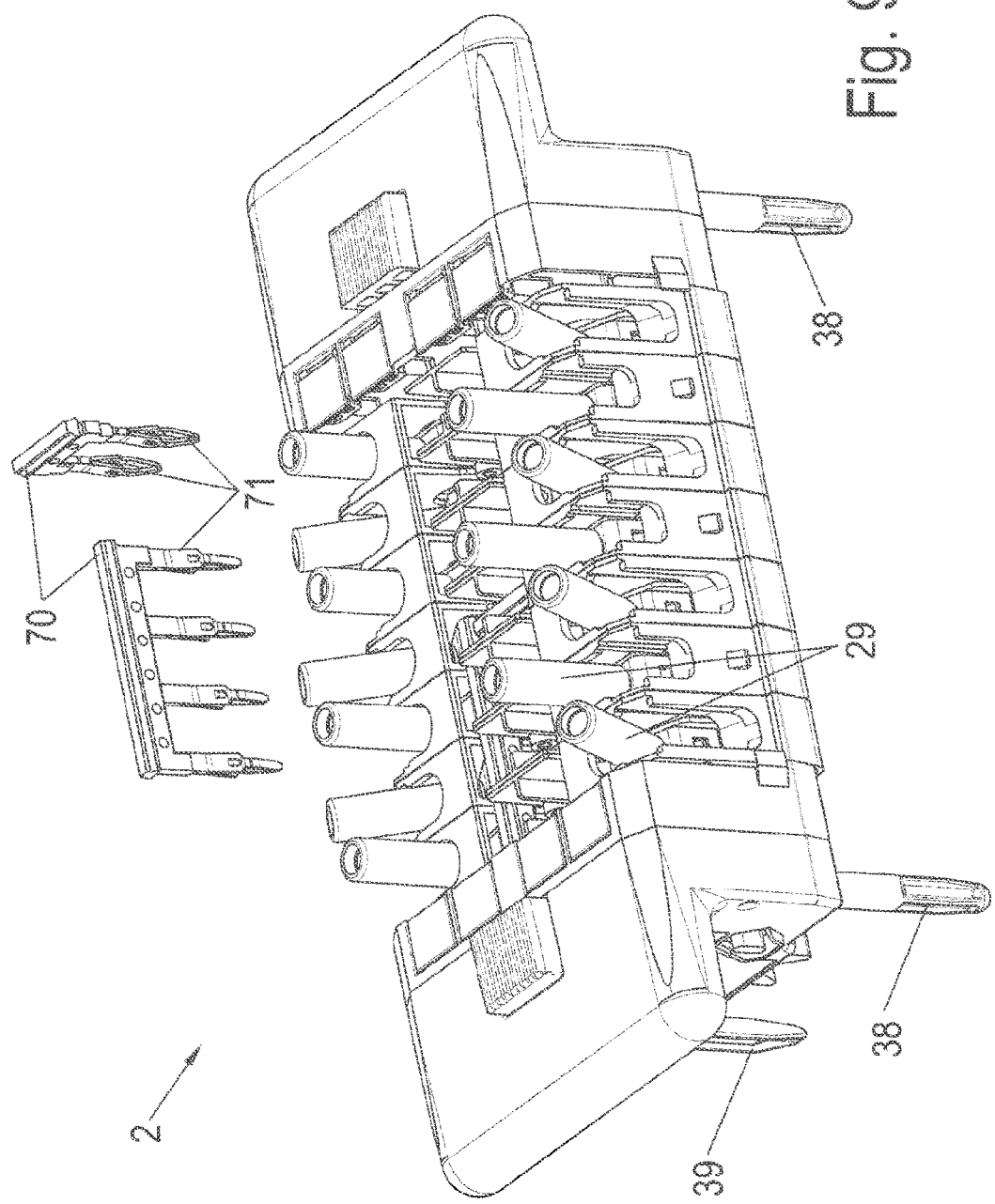

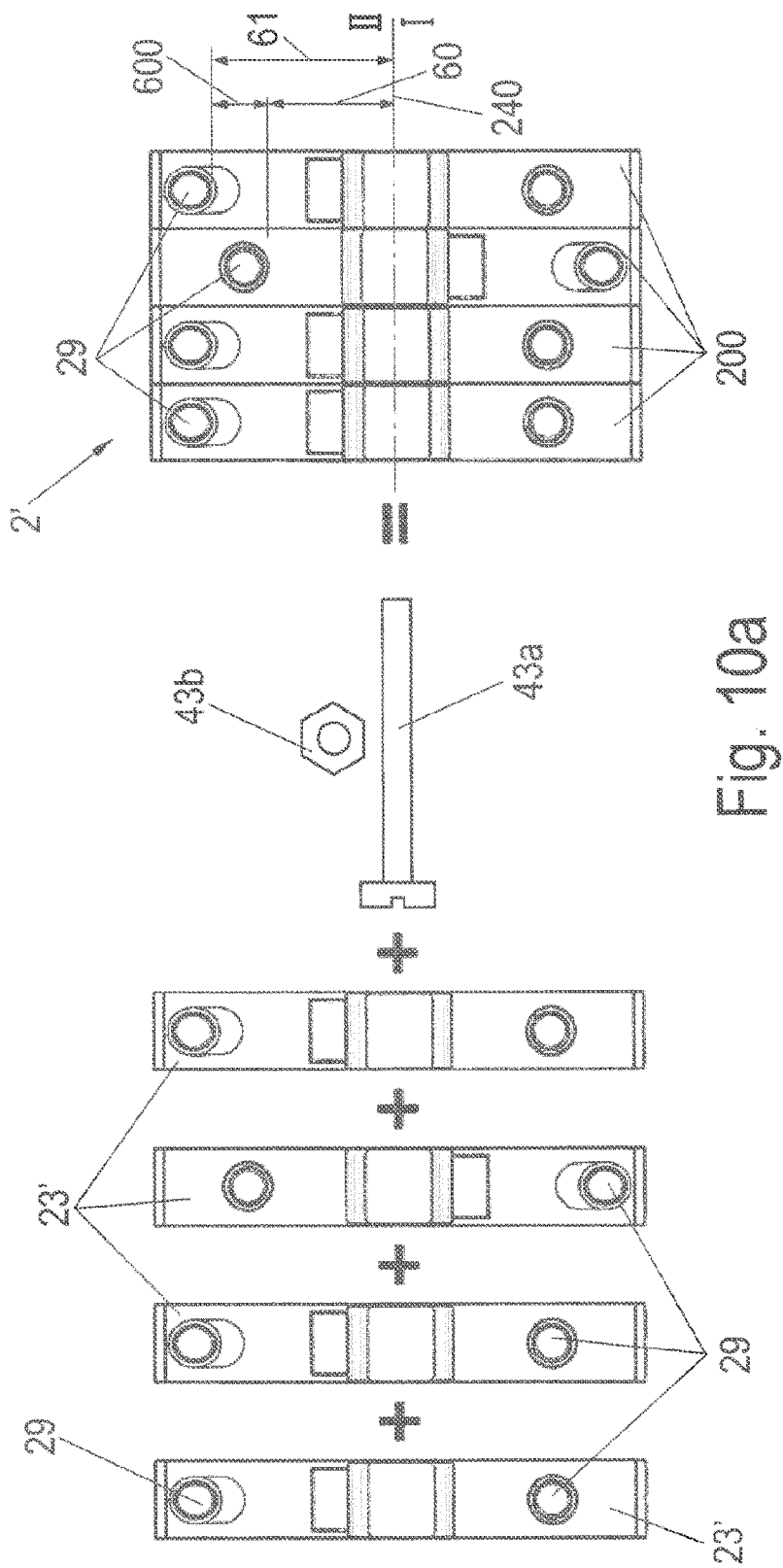

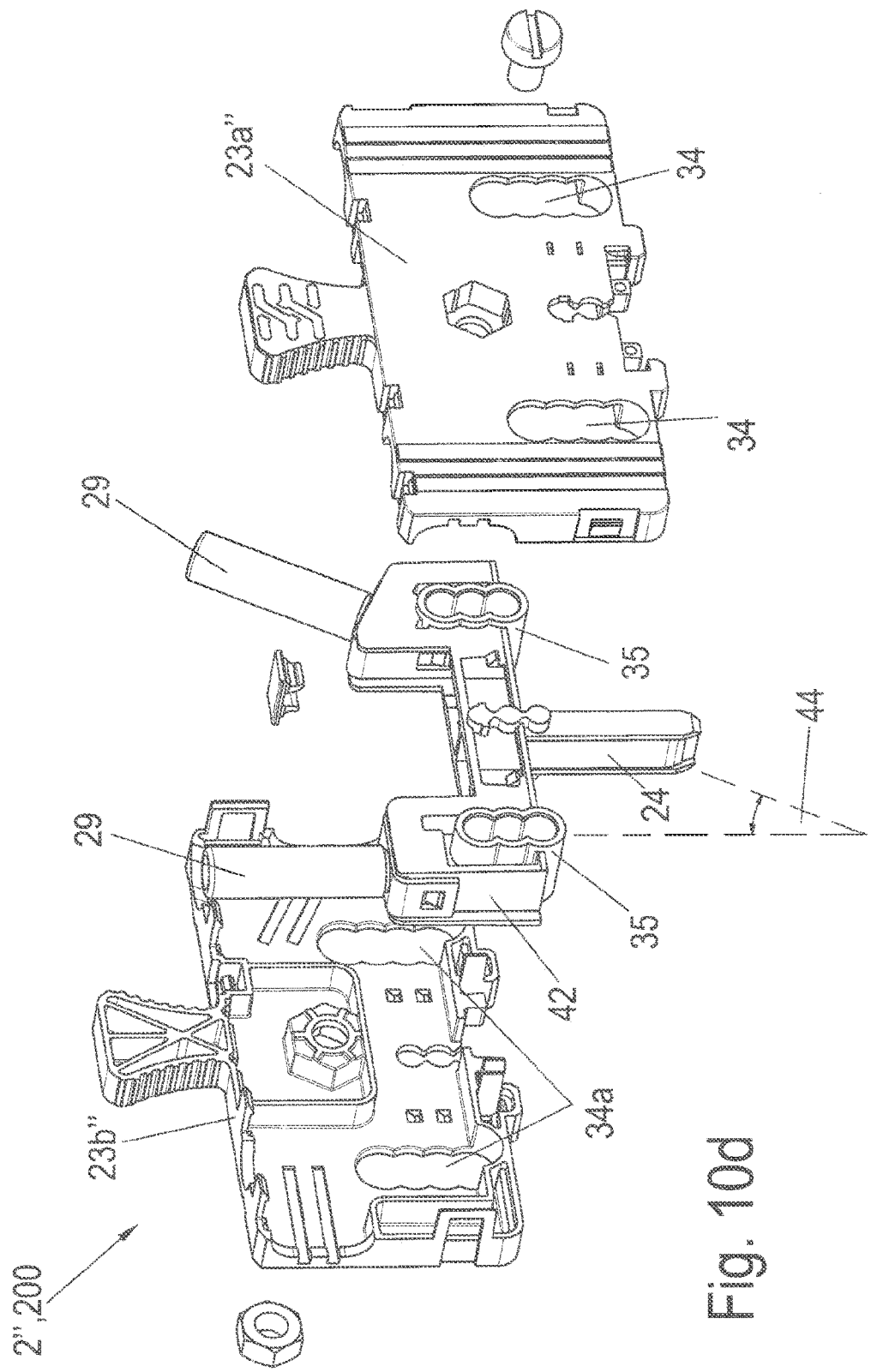

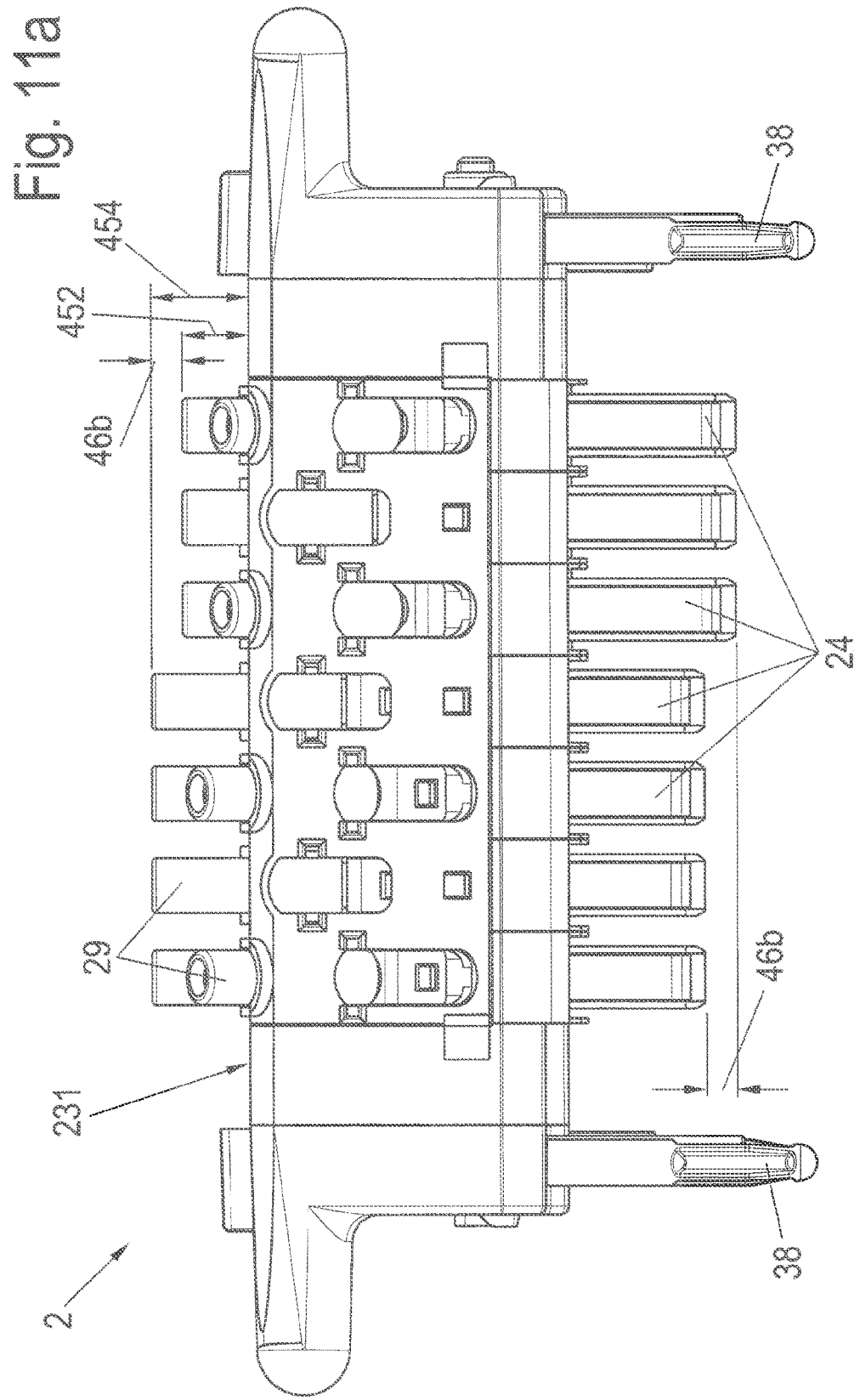

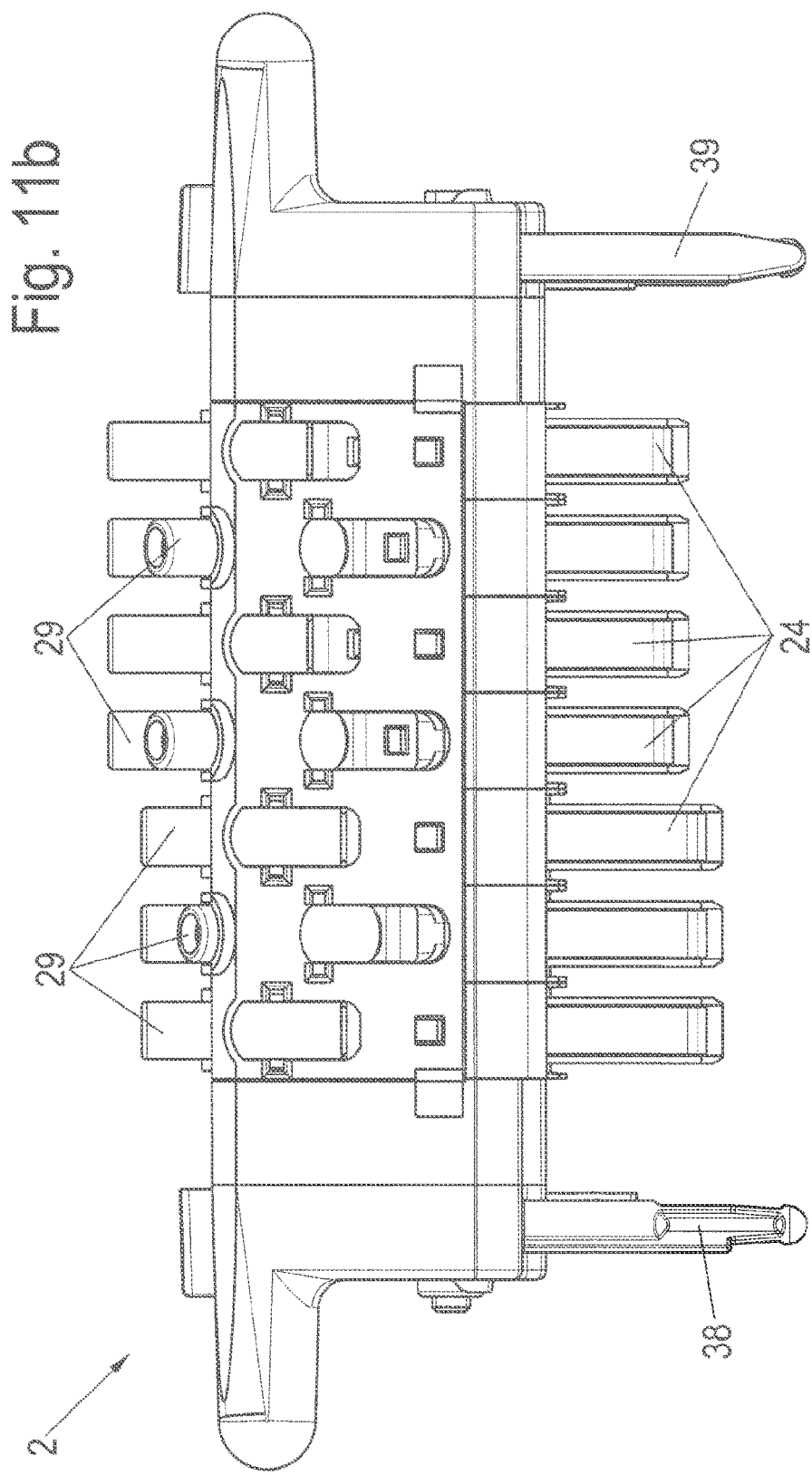

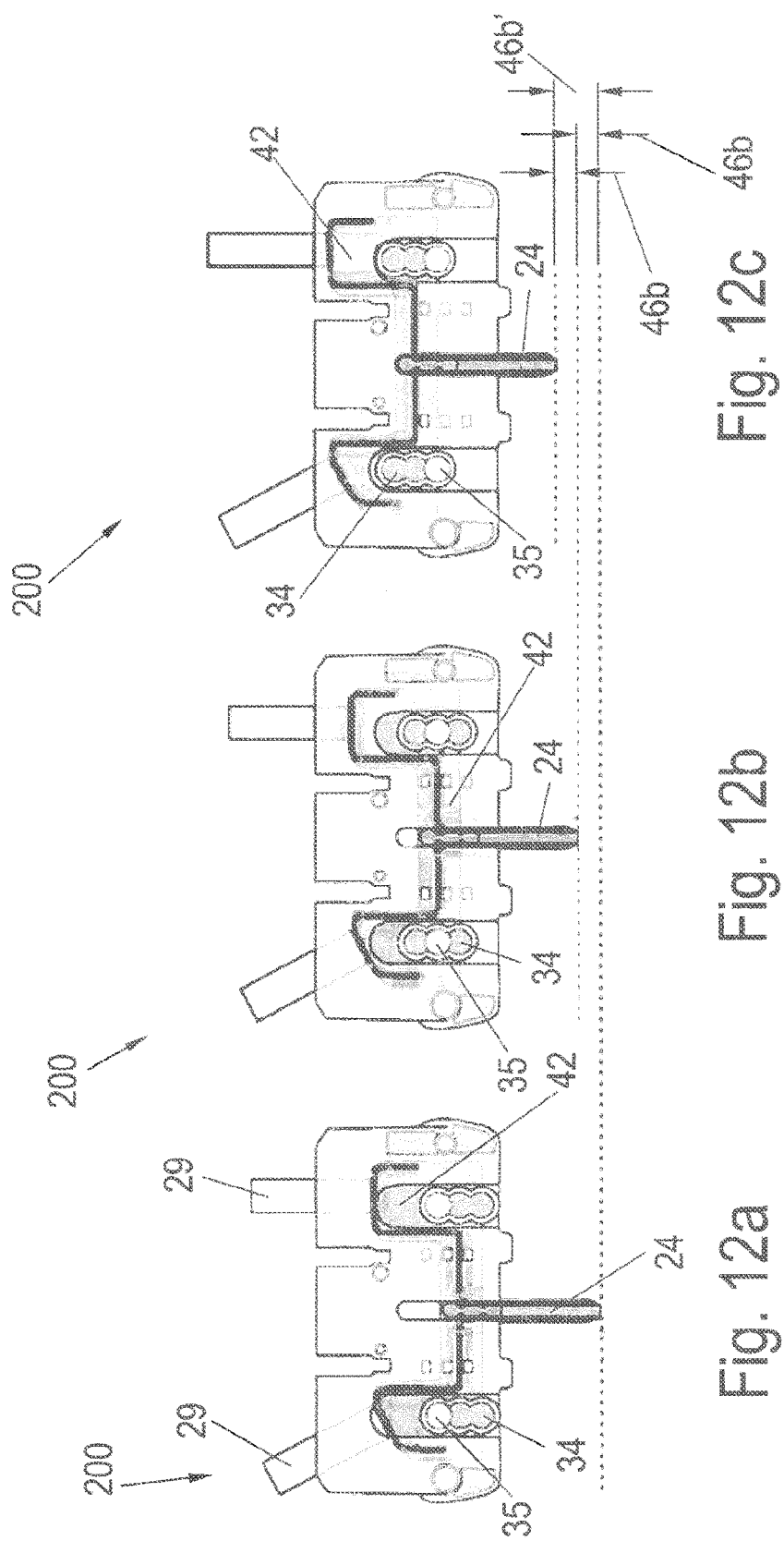

TEST AND CONNECTION APPARATUS ARRANGEMENT, AND TEST APPARATUS

REFERENCE TO RELATED APPLICATIONS

This application is a national stage application under 35 U.S.C. §371 Of PCT application No. PCT/EP2012/059392 filing May 21, 2012, which claims priority of German application No. DE 20 201 101 414.6 filed Jun. 3, 2011. It is a companion application of U.S. Ser. No. 14/087,115 filed Nov. 22, 2013, and U.S. Ser. No. 14/119,968 filed Nov. 25, 2013.

BACKGROUND OF THE INVENTION

1. Field of the Invention

A testing arrangement for testing the electrical circuits of a terminal block assembly, comprising a generally rectangular testing unit housing formed of insulating material and containing a chamber, at least one connection device mounted in chamber and having an elongated connector body formed of insulating material and including center and end portions. An integral measuring tab portion extends downwardly from the body center portion for insertion into a testing opening contained in the terminal block assembly, and a pair of coplanar measurement portions extend upwardly from the connector body ends and terminating at different elevations, thereby to afford a compact testing arrangement. Two electrical circuit connecting portions are mounted on the connector body, each including an input conductive contact plate mounted on one side of said measuring tab portion, and an output contact mounted within one of said measurement portions for connection with one end of a testing component.

2. Description of Related Art

It has been proposed in the prior art to provide a testing arrangement for testing the circuits of a terminal block assembly. Such an arrangement contains a connection device for connecting electrical conductors and a testing device which can be connected to the connection device, in order to test and to measure electrical quantities which are associated with the connected electrical conductors and the electrical apparatus connected thereto. In the process, measurement and testing processes are carried out without any change to the existing current circuits. A particular advantage of such an arrangement is that the testing device for the measurement of operation-relevant quantities can be placed, during ongoing operation of the electrical apparatuses, on the connection device. Therefore, the arrangement allows a measurement of the operation-relevant quantities without interrupting an ongoing production operation.

Given the continually increasing need for such arrangements, for example, in the automation sectors, there is a demand for improved functional groups as well as for a broader range of operation.

The present invention was developed therefore to provide an improved testing device which has a compact construction, which can be operated easily, and which can have a very large variety of uses in highly complex applications. The testing device has a very compact construction and it is easy to operate. It allows numerous, including possibly simultaneous, testing operations, so that it can also be used in more complex applications.

SUMMARY OF THE INVENTION

Accordingly, a primary object of the present invention is to provide a compact testing arrangement for testing the electrical circuits of a terminal block assembly, comprising a generally rectangular testing unit housing formed of insulating material and containing a chamber, at least one connection device mounted in chamber and having an elongated connector body formed of insulating material and including center and end portions, an integral measuring tab portion extends downwardly from the body center portion for insertion into a testing opening contained in the terminal block assembly, and a pair of coplanar measurement portions extending outwardly from said connector body ends and terminating at different height elevations.

According to another object of the invention, an electrical testing component associated with the connection device is connected with a circuit of the terminal block assembly that is to be tested by means of two electrical circuit connecting portions mounted on the connector body, each of said connecting portions including an input conductive contact plate mounted on one side of said measuring tab portion, and an output contact mounted within one of said measurement portions for connection with a corresponding end of the testing component.

The testing arrangement allows the advantages of using the measurement and testing processes outside of the product into which the connection device is incorporated, while at the same time increasing the connection possibilities of the testing device. Moreover, it is easy to operate.

The testing device according to the invention for a testing and connection device arrangement includes a testing unit, which includes a connection unit, which comprises a tab element for breaking an electrical connection as well as two first measurement connections, wherein, on the pin element, two electrically conducting contact plates are arranged, which in each case are connected in an electrically conducting manner to one of the two first measurement connections. It is characterized in that the measurement connections are arranged on the side of the testing unit which is located opposite the pin element, and in that they are arranged at an angle relative to one another and/or vertically offset relative to one another.

As a result of the angled and/or vertically offset arrangement of the first measurement connections relative to one another, the first measurement connections are very easily accessible, and it is possible to arrange simultaneously several large measurement heads in the first measurement connections. In addition, the arrangement of the several measurement heads is very simple owing to the angled offset and/or the vertical offset. The first measurement connections are preferably configured as sockets, in particular for receiving probe heads. In particular, they are preferably provided for receiving conventional probe heads.

The first measurement connections are provided for tapping the voltage applied to the electrically conducting contact plates. They allow the connection of testing means, in particular of measurement meters, such as, for example, a voltage meter, a current meter, a frequency meter, a power and/or a resistance meter.

In a preferred embodiment, the testing device includes a testing device housing for receiving the connection unit, wherein the connection unit is height adjustable relative to the testing device housing. Such a height adjustment is possible preferably in the context of the installation of the testing device. It has the advantage that the pin element is vertically offset with the connection unit.

It is also preferable for the testing device to include several testing units arranged one after the other each with a connection unit. It is particularly preferable for the connection units of the several testing units to be arranged vertically offset relative to one another. As a result of the vertically offset arrangement of the connection units relative to one another, a targeted control of the time at which the voltage applied to the first contact tabs of various testing units is tapped is possible.

In addition it is preferable for the testing device to include a testing device housing for receiving the testing units, or for it to include a testing device housing for each testing unit. In the first mentioned embodiment, the vertical offset of the measurement connections can be achieved by the height adjustment of the connection units relative to the one testing device housing. In the last mentioned embodiment, the vertical offset of the measurement connections can be achieved by the height adjustment of the connection units relative to the testing device housing of its testing unit.

However, it is also preferable for the testing device housing of the testing units to be height adjustable relative to one another, so that a vertical offset by the height adjustment of the testing device housing and/or of the connection units is achievable.

In an additional preferred embodiment, which also solves the problem, the testing device includes at least two testing units, each including a connection unit, wherein the connection units each comprise a pin element for breaking an electrical connection as well as two first measurement connections, wherein, on the pin elements, in each case two electrically conducting contact plates are arranged, each of which is connected in an electrically conducting manner to one of the first two measurement connections of the same connection unit. The testing device of this embodiment is characterized in that the measurement connections are arranged on the side of the testing unit which is located opposite the pin element, and in that the testing unit and/or the connection units are arranged vertically offset relative to one another.

In a complex testing device with several testing units, numerous height differences of the first measurement connections are thus achievable. As a result, even in the case of the use of relatively large probe heads, easy insertion into the first measurement connections and detachment of the probe heads from the first measurement connections are possible. At the same time, the testing device can be constructed in a more compact manner in comparison to a testing device in which the first measurement connections are not arranged at angularly and/or vertically offset relative to one another.

In a preferred embodiment, one of the two electrically conducting contact plates of the two connection units is arranged in each case on a first side of the testing device, and the other of the two electrically conducting contact plates of the two connection units is arranged in each case on a second side of the testing device, which is located opposite the first side, wherein the first measurement connections of the connection units, which are arranged on the first side, and/or the first measurement connections of the connection unit, which are arranged on the second side, are arranged at an angle relative to one another. As a result, the first measurement connections arranged on the same side of the testing device are in an angular arrangement relative to one another, and the space available for the probe heads is increased.

Moreover, it is preferable to arrange the connection units or the testing units in a mirror image arrangement relative to one another. As a result, the first measurement connections of the testing units arranged one after the other are in a. In the case of more than two successively arranged testing units, a first measurement connection therefore always alternates with a first measurement connection arranged at an angle with respect to the former first measurement connection. In this arrangement, a probe head which is inserted into one of the first measurement connections has available to it a considerably larger installation space, preferably one that is twice as large, in comparison to a testing device in which the first measurement connections are not angularly or vertically offset with respect to one another.

In a preferred embodiment, the angle at which the first measurement connections of the same testing unit are arranged relative to one another is the same in all the testing units. However, an embodiment in which the angles at which the first measurement connections are arranged relative to one another are different is in principle also preferable. It is also preferable for said connections to be provided in a manner so that they are rotatable.

In a particularly preferred embodiment, the first measurement connections of all the testing units are identical, in particular of identical length. However, a testing device in which different first measurement connections are provided for receiving different measurement heads is also conceivable. For example, conventional probe heads of different designs, or banana plugs, are considered measurement heads here.

Furthermore, it is preferable for the connection unit for each first measurement connection to comprise in each case a second measurement connection, which is arranged at a right angle to the first measurement connection. The second measurement connection is also provided for tapping the voltage of the contact plates, and it allows the connection of one or more additional testing means. The second measurement connections are designed preferably as screw or clip sockets for connecting an electrical conductor.

The problem is solved furthermore by a testing and connection device arrangement with such a testing device and with a connection device into which the testing device can be inserted, wherein the testing device separates two first electrically contacting contact tabs at the time of the insertion into the connection device.

In the case of a testing device which is inserted into the connection device, it is therefore preferable for the voltage applied to the contact tabs to be applied to the contact plates of the connection units.

In such a testing and connection device arrangement, with a testing device and with a connection device for the connection of electrical conductors, the connection device preferably comprises at least two attachable holders, each of which comprises supporting rail holding sections for a supporting rail installation of the connection device, and wall holding sections for a wall installation of the connection device.

The attachable holders can be provided, for example, on the bottom side of the housing of the connection device, in order to secure the connection device both on a supporting rail and also on a wall element. As a result, the possibility of installation on numerous sides using identical holders is created.

In one embodiment, it is provided that the testing device can be inserted from a top side of the connection device and from a bottom side of the connection device into the connection device. As a result, it is possible to use the arrangement on several sides.

For the insertion of the testing device on two sides, from a top side of the connection device and from a bottom side of the connection device, the connection device is designed with first and second compression springs.

Yet another embodiment provides that the connection device is configured for the insertion of a testing device on two sides, from a top side of the connection device and from a bottom side of the connection device, with first and second contact tabs. When the second contact tabs with the first electrically contacting contact tabs are arranged one above the other, the result is an increase in the possibilities of attaching the testing device, wherein additional or complicated constructions are no longer needed.

In a further embodiment, the second contact tabs and the first electrically contacting contact tabs are connected electrically in parallel. This is possible in a simple manner within the connection device, without any increase in its volume.

Here, it is advantageous if the second contact tabs or the first mutually electrically contacting contact tabs are electrically insulated by means of a removable plug element. This removable plug element makes it possible to adapt the connection device to its application purpose accordingly simply by re-plugging, without the need for another construction.

In yet another embodiment, the connection device comprises at least one protection element which, from a first position, in which it closes actuation sections for clamping units of the connection device, which are located underneath, can be reset into a second position, in which the actuation sections are accessible. As a result, a simpler and more rapid manipulation protection is made possible.

In a further embodiment, the at least one protection element is held in a manner so that it can be shifted in a guide of a housing of the connection device in the longitudinal direction of the connection device. Such a design is simple and here the protection element can be adjusted easily and rapidly.

It is provided here that at least one protection element comprises in each case a cover area with one cover opening per clamping unit. In this manner, a protection element for a certain number of clamping units can be adapted simply by cutting to length.

BRIEF DESCRIPTION OF THE DRAWINGS

Other objects and advantages of the invention will become apparent from a study of the following specification, when viewed in the light of the accompanying drawing, in which:

FIG. 4b is a partially exploded perspective view of the terminal block assembly;

FIG. 8a is an exploded end perspective view of the terminal block assembly;

FIGS. 8b and 8c are detained perspective views of the end support member arrangement, and FIGS. 8c-8i are side elevation views, with certain parts removed, illustrating the operation of the end support member;

FIG. 9a is a sectional side elevation view of the testing unit of the present invention;

FIG. 9c is a top plan view of the testing unit;

FIG. 9d is an end view of the testing unit;

FIGS. 9e and 9f are front perspective and top plan views, respectively, of the testing unit with the probe heads attached thereto;

FIG. 9g is and exploded perspective view of the testing unit;

FIG. 10a is a diagrammatic top illustration of a second embodiment of the invention;

FIG. 10b is a diagrammatic end view of an arrangement of the apparatus of FIG. 10a;

FIG. 10c is a perspective side view of one of the testing units of the apparatus of FIG. 10a;

FIG. 10d is an exploded view of the apparatus of FIG. 10c;

FIGS. 11a and 11b are right hand and left hand side views of the assembled testing arrangement, FIGS. 12a-12c are diagrammatic side view illustrating the adjustability of the connector device to various height positions relative to its housing.

DETAILED DESCRIPTION OF THE INVENTION

Figure 1:
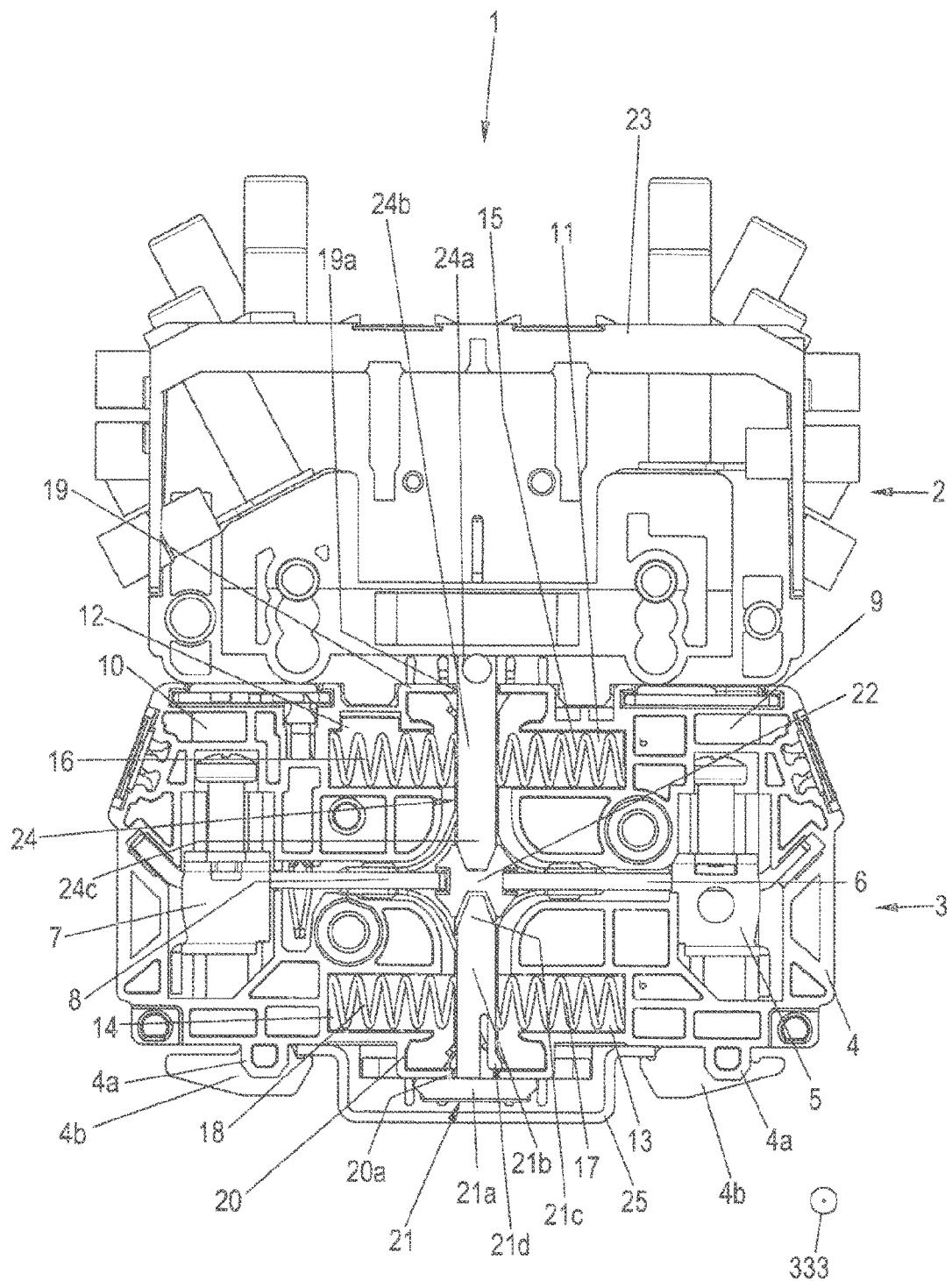
FIG. 1 is a partly sectioned side elevation view of testing arrangement with the terminal block assembly mounted on a mounting rail, and with the testing device mounted above the terminal block assembly.
Figure 2:
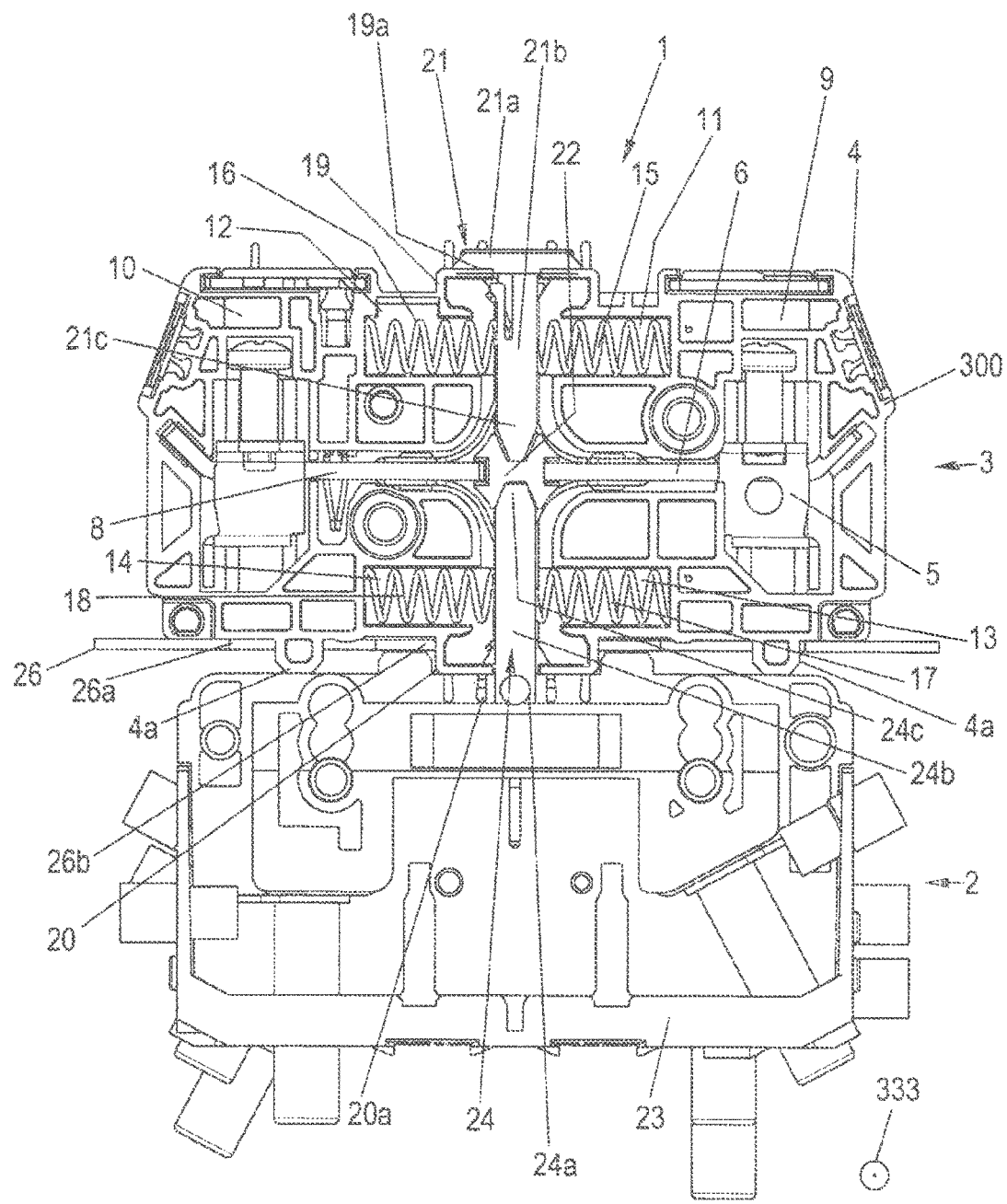
FIG. 2 is a partly sectioned side elevation view with the terminal block assembly mounted above an opening contained in a fixed support wall, and with the testing device mounted below the terminal block assembly and below the support wall, a dummy plug being inserted via an opening contained in the top wall of the terminal block.
Figure 4A:
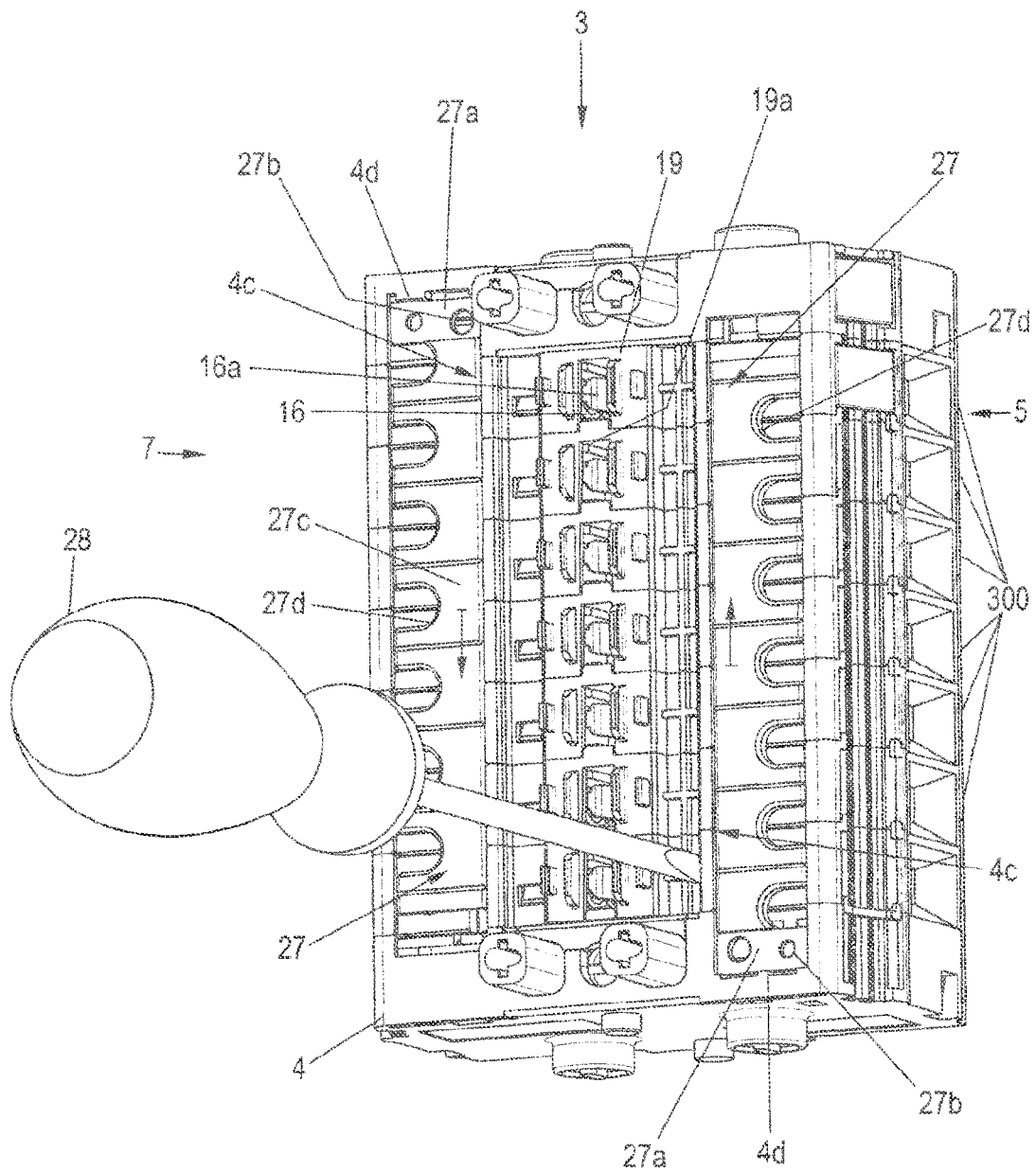
FIG. 4a is a top perspective view of the terminal block assembly, together with an operating tool for adjusting a protective cover between the closed and open positions.

As a broad overview, referring first to FIG. 1, the terminal block testing arrangement 1 includes a testing device 2 for testing a terminal block assembly 3 that is mounted on a mounting rail 25. The terminal block assembly includes a plurality of terminal blocks 300 arranged in stacked side-by-side relation, which components are connected by connecting means 4 (FIG. 4a) to define the assembly 3, as will be described below (and in the companion U.S. application Ser. No. 14/087,115). Each terminal block 300 has a rectangular body formed of thermoplastic synthetic plastic insulating material, as is known in the art. The terminal block body includes chambers that contain a pair of horizontal coplanar conductive bus bar members 6 and 8 that are separated at their adjacent ends by an electrically insulating spacer member 22. At their remote ends, the bus bars are connected with screw-operated conductor clamping devices 5 and 7, respectively, that connect with the bus bars the bare ends of conductors (not shown) that extend normal to the terminal block side walls. Access chambers 9 and 10 are provided in the upper wall of the terminal block above the clamping devices 5 and 7, respectively, which chambers are closed by the protective slide members 27 (FIGS. 2, 4a and 4b).

Respectively connected with the upper surfaces of the bus bars 5 and 7 are upper leaf spring contacts 15b and 16b (FIG. 3) having upper tip portions 15a and 16a that are biased toward electrical engagement by compression springs 15 and 16 mounted in the terminal block. In the first chambers 11 and 12, the first compression springs 15 and 16 are inserted in a pre-stressed state, so that a certain contact pressure of the first contact tabs 15a and 16a is present when they are in contact.

Similarly, there are connected with the lower surfaces of the bus bars the lower leaf spring contacts 17b and 18b which are biased toward electrical engagement by the compression springs 17 and 18, respectively. The second compression springs 17 and 18 are also inserted into the second chambers 13 and 14 in a pre-stressed state, in order to generate a certain contact pressure at the time of the contacting of the second contact tabs 17a and 18a.

In FIG. 1a, the tips of these lower leaf spring contacts are separated by the dummy insulating pins 21 having locking tabs 21a, and the tips of the upper leaf spring contacts are separated by the insulated test plug 24 of the testing device 2 inserted through opening 19a contained in the terminal block top wall, whereby the bus bars 6 and 8 are in a disconnected testing condition. Basically, this arrangement corresponds with a pair of on-off switches connected in parallel across conductor clamping contacts 5 and 7.

The testing device 2 serves for testing and measuring electrical quantities of electrical appliances hooked up to the terminal block assembly, which shall not be described in further detail. The testing device 2 has a housing 23, and is described in greater detail in the companion application Ser. No. 14/087,115. In the housing are arranged not otherwise specified plug and switch devices for testing and/or measuring purposes. On the bottom side of the testing device 2 are arranged pin elements 24, of which only one is shown here as an example for all the others. With these pin elements 24 and optionally other switches, which will not be discussed further, the testing device 2 is inserted into the connection device 3. As will be described in greater detail below, the bottom portion of the terminal block connecting means 4 is provided at opposite ends with pairs of mounting feet 4a (FIG. 6) that serve to mount the assembly on the inverted hat-shaped mounting rail 25 (FIG. 1).

As shown in FIG. 4a, the terminal block assembly 3 includes a stack of seven terminal blocks 300 that are connected together in contiguous side-by-side relation by connecting means 4. As is described below in connection with FIG. 8a, these connecting means include a pair of end units that are connected together by longitudinal locking rods that extend through openings contained in the terminal block stack. The terminal blocks 300 are designed for connection with electrical conductors (not shown), which can be introduced essentially at right angles to the longitudinal axis of the assembly 3 (which is normal to the plane of the drawing in FIGS. 1 and 2) from either side into the connector units 300 and fastened in clamping units 5 and 7. The clamping units 5 and 7 in this sample arrangement are shown as one pair, but of course even larger numbers of pairs are possible.

Referring now to FIG. 2, the terminal block assembly 3 of FIG. 1 is arranged above an opening 26a contained in horizontal wall 26, and the testing device is inverted and arranged below the wall opening, with the test plug 24 extending upwardly through an opening 20a contained in the terminal block lower wall to effect separation of the leaf spring contacts 17a and 18a. A dummy plug 21 is inserted downwardly through the upper wall opening 19a to effect separation of the upper pair of leaf spring contacts 15b and 16b. The terminal block support feet 4a and the lower central portion of the terminal block extend into the wall opening 26a. Thus, the connection device 3 can be assembled with the testing device 2 from either side.

Figure 3:
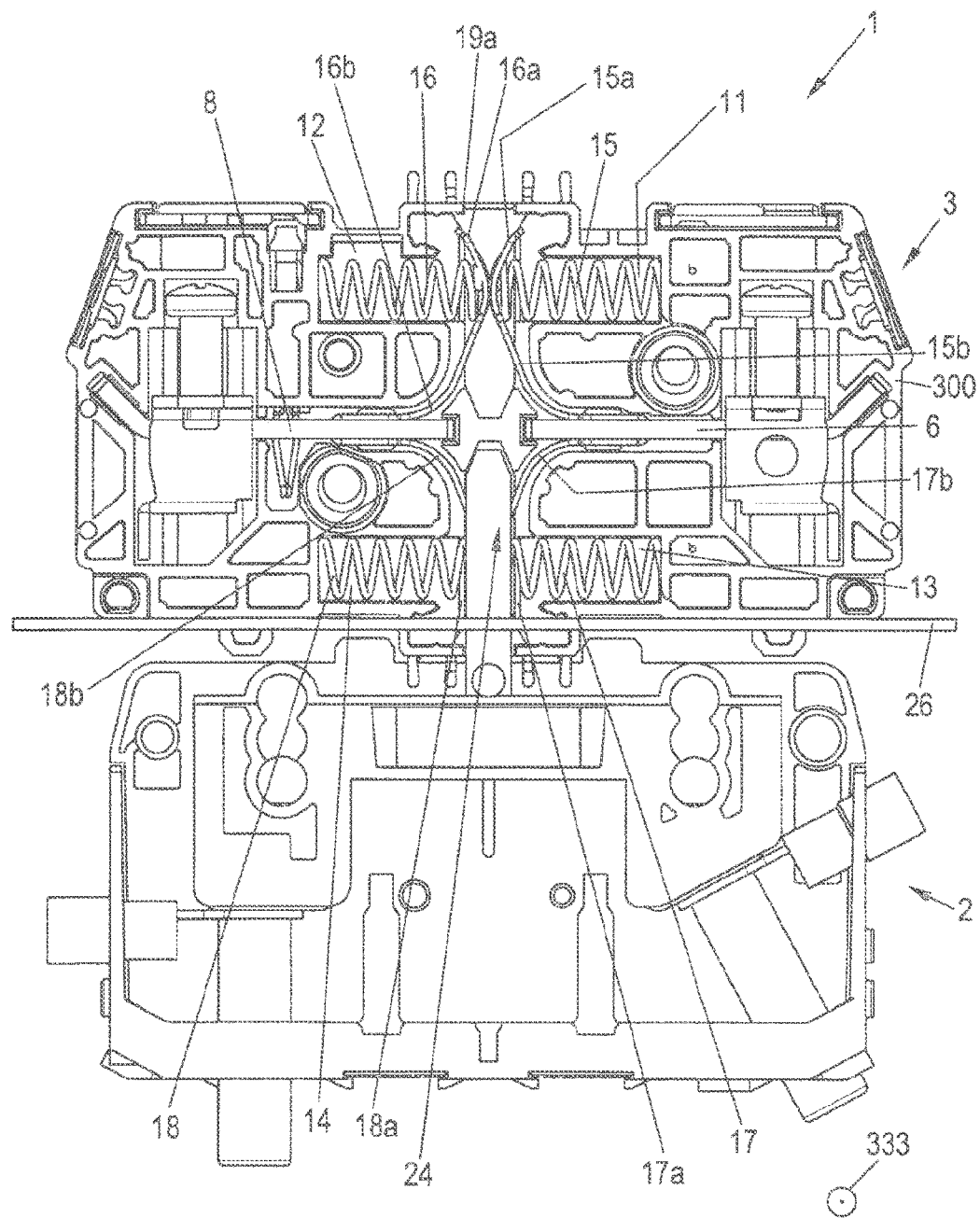
FIG. 3 is a partly sectioned side elevation view corresponding to FIG. 2 with the dummy plug removed.

FIG. 3 illustrates the first and second pairs of contact tabs 15a, 16a and 17a, 18a connected with the upper and lower surfaces of the bus bar sections, respectively. The first and second contact tabs 15a, 16a and 17a, 18a face each other as pairs between the first compression springs 15 and 16, and the second compression springs 17, 18. The second contact tabs 15a and 16a make contact, since as of yet no plug element 21 has been inserted. The first and second contact tabs 15a, 16a and 17a, 18a have spring segments 15b, 16b, 17b, 18b, by which they are secured in electrically conducting manner on the bus bars 6 and 8. Therefore, in mirror image to the bus bars 6, 8, the facing contact tabs 15a, 17a and 16a, 18a are joined together in electrically contacting manner by the bus bars 6, 8.

In other words, the contact tabs 15a and 17a are connected to the bus bar 6, and the contact tabs 16a and 18a to the bus bar 8. In FIG. 3 the upper first contact tabs 15a and 16a are represented without plug element 21, while the lower second contact tabs 17a and 18a are forced apart by the pin element 24.

As shown in FIGS. 4a and 4b, the terminal block assembly includes two sliding protective members 27 mounted in guides 4c for sliding movement by tool 28 between a first dust-protecting covering position (FIG. 4a) above the access openings 9 and 10, and an uncovered open position (FIG. 4b). In the open position of FIG. 4b, openings 27d in the protective members are arranged above the access openings in the terminal blocks. As shown in FIG. 4b, conductive bridge members 70 having downwardly extending leg portions 71 may be inserted into the access openings for engagement with the corresponding clamping devices, thereby to connect together selected ones of the terminal blocks.

Figure 5:
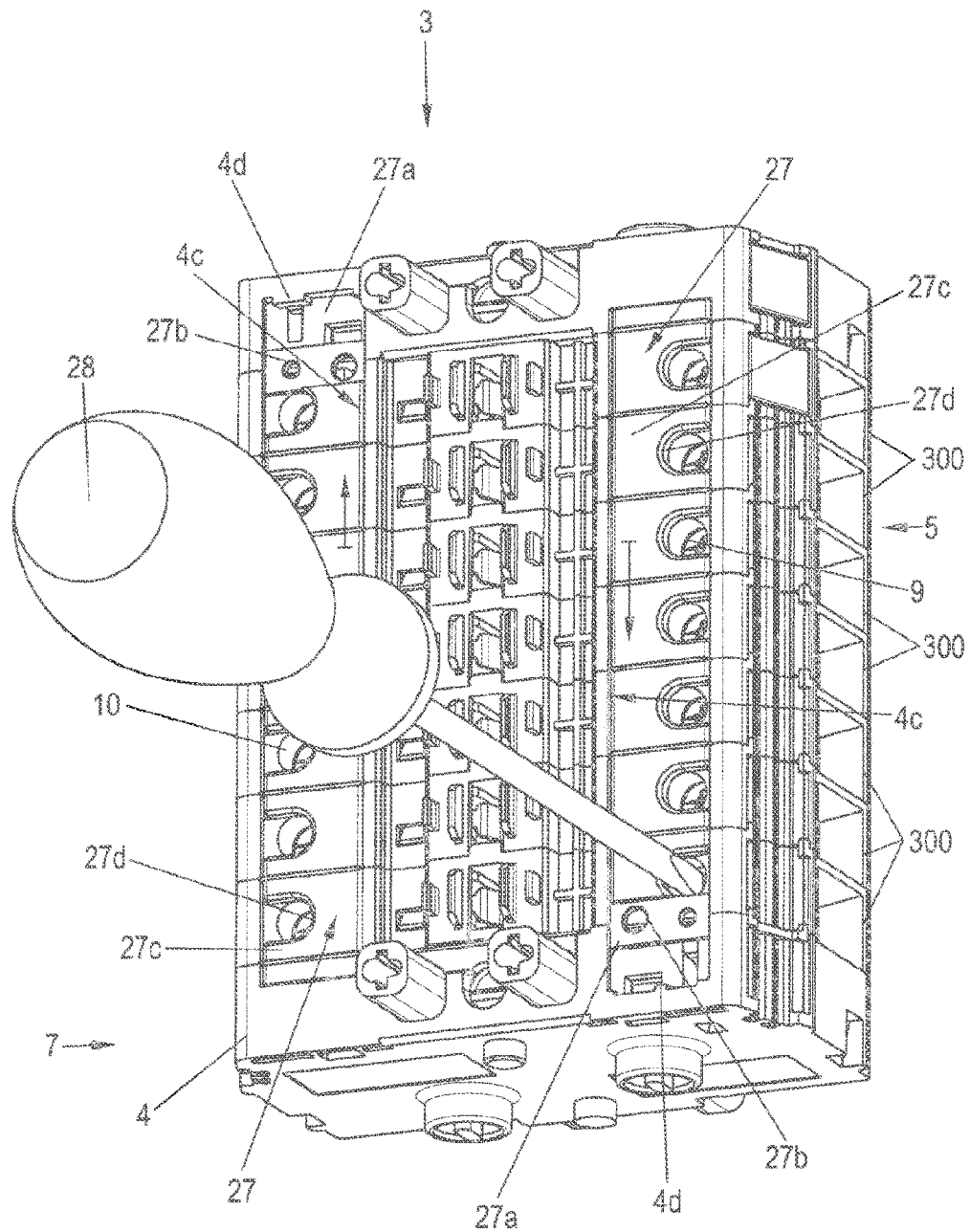
FIG. 5 is a top perspective view of the terminal block assembly, together with an operating tool for adjusting the protective covers when in the open position.

In FIG. 5, it will be seen that the protection elements 27 have been shifted so that the cover openings 27d of the cover fields 27c are arranged above the activating segments 9 and 10 of the clamping units 5, 7 and an access to the clamping units 5, 7 is possible, for example, with the tool 28 (i.e., a screwdriver). The activating parts 27a of the protection elements 27 are arranged here at a distance from the end stops 4d of the housing 4.

Figure 6:
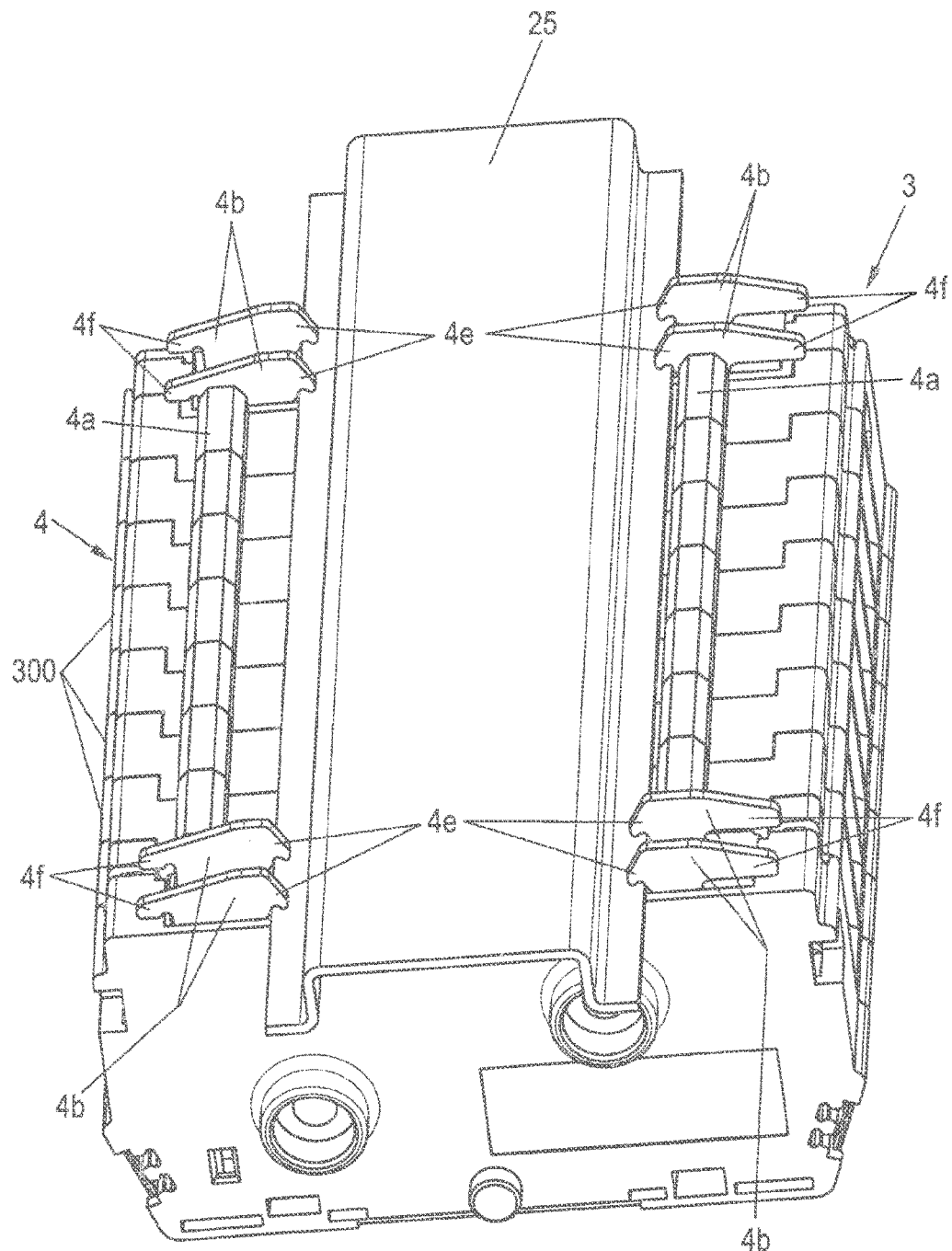
FIG. 6 is a bottom perspective view of the terminal block assembly when mounted on a mounting rail.

In the bottom perspective view of FIG. 6, it will be seen that the terminal block assembly 3 is mounted on the mounting rail 25 by two pairs of mounting feet that extend downwardly at each end of the assembly. Each support foot 4b has one end pointing inward toward the mounting rail 25 with a mounting rail support section 4e in the form of a lug. At the other ends, each of which points outward, the support feet s 4b are configured with arm-like bracket sections 4f. These support feet are arranged at the lower edge portions of the end support members 400 (FIG. 8a). During the mounting of the assembly 3 on the mounting rail 25 as shown in FIG. 6, the assembly 3 is held on the mounting rail 25 by means of the mounting rail support sections 4e of the support feet, as the mounting rail support sections 4e reach around a segment of the mounting rail 25. For this, the holders 4b can be inserted or locked in corresponding recesses of the housing 4 in the position shown after the connection device 3 has been placed in them, or they can be shoved toward each other in the direction of the mounting rail 25 to create the reaching across the mounting rail support section 4e. But the connection device 3 can also be shoved onto the mounting rail 25 in its longitudinal direction. Other options are conceivable, of course.

Figure 7:
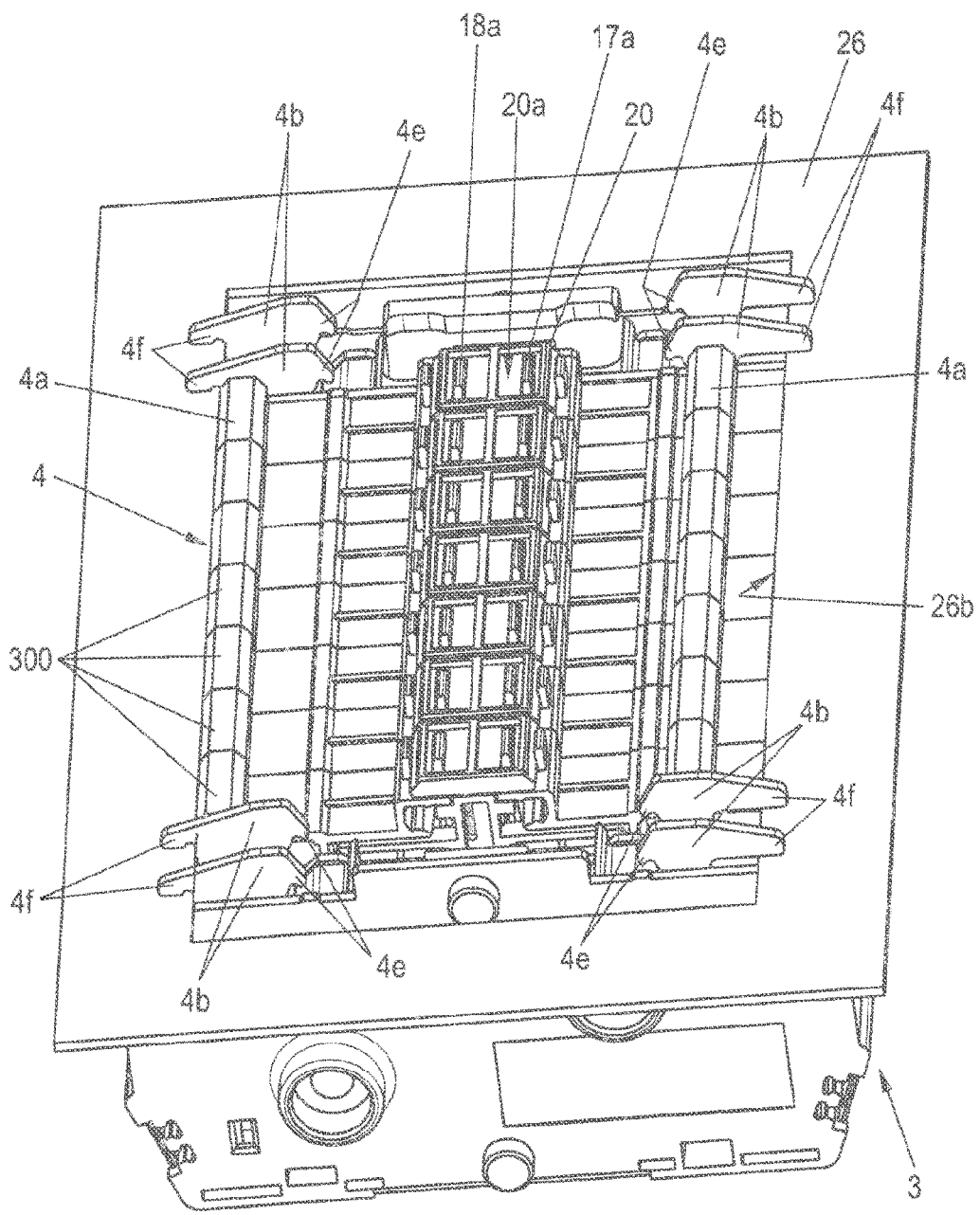
FIG. 7 is a bottom perspective view of the terminal block assembly when mounted in a wall opening.

In FIG. 7, the terminal block assembly 3 is supported by the lug portions 4f of the mounting feet 4b in the wall opening 26b. In this arrangement, the mounting feet 4b and the center portion 307a of the assembly extend below the plane of the horizontal wall 26.

Referring now to FIG. 8a, the stacked terminal blocks 300 are assembled by assembling means 4 including end connecting units 302 arranged at opposite ends of the stack, which end units are connected by connecting rods 450 that extend longitudinally through aligned openings contained in the terminal blocks. Each end unit includes a four-sided body member that cooperates with an end locking plate 301 to define a chamber 307 that is open at its bottom. The locking nuts 451 at the ends of the locking rods 405 are retained against rotation by the corresponding non-circular openings contained in the locking plate 301. Mounted for vertical displacement in this chamber is an inverted U-shaped end support member 400 which includes at it lower portion two pairs of downwardly-extending support feet 4b. Arranged within the support member 400 is an adjustment element 440 (FIG. 8b) that is vertically displaceable by the cooperation between adjusting screw 304 and nut 305. Therefor, upon tightening of the screw 304, the adjusting element 440 and the support member 400 are displaced upwardly (FIG. 8d) to bring the support feet 4b and the bottom of the assembly into tight engagement with the lower and upper surfaces of the horizontal wall 26. It will be seen that in this wall-mounted arrangement, the assembly center contact area 307 and the support feet 4b extend below the lower surface of the support wall 26. Similarly, in the mounting rail arrangement of FIG. 8f, the mounting feet 4b extend below the mounting rail outwardly-directed flange portions, and the assembly lower center portion extends within the mounting rail chamber.

As shown in FIGS. 8g and 8h, when the support member 400 is in the lower connecting position with the support feet 4b extending below the end member housing 302, the assembly is tilted (FIG. 8g) to effect engagement of the right hand support feet with the associated edge of the opening 26a contained in the wall surface 26. The assembly is then tilted downwardly to the horizontal position, and is shifted slightly to the left (FIG. 8h) so that the remote lug portions of the support feet extend under the lower surface of wall 26. Screw 304 is then operated to draw the support member 400 and the support feet 4b upwardly toward the locked position of FIG. 8i.

Figure 9B:
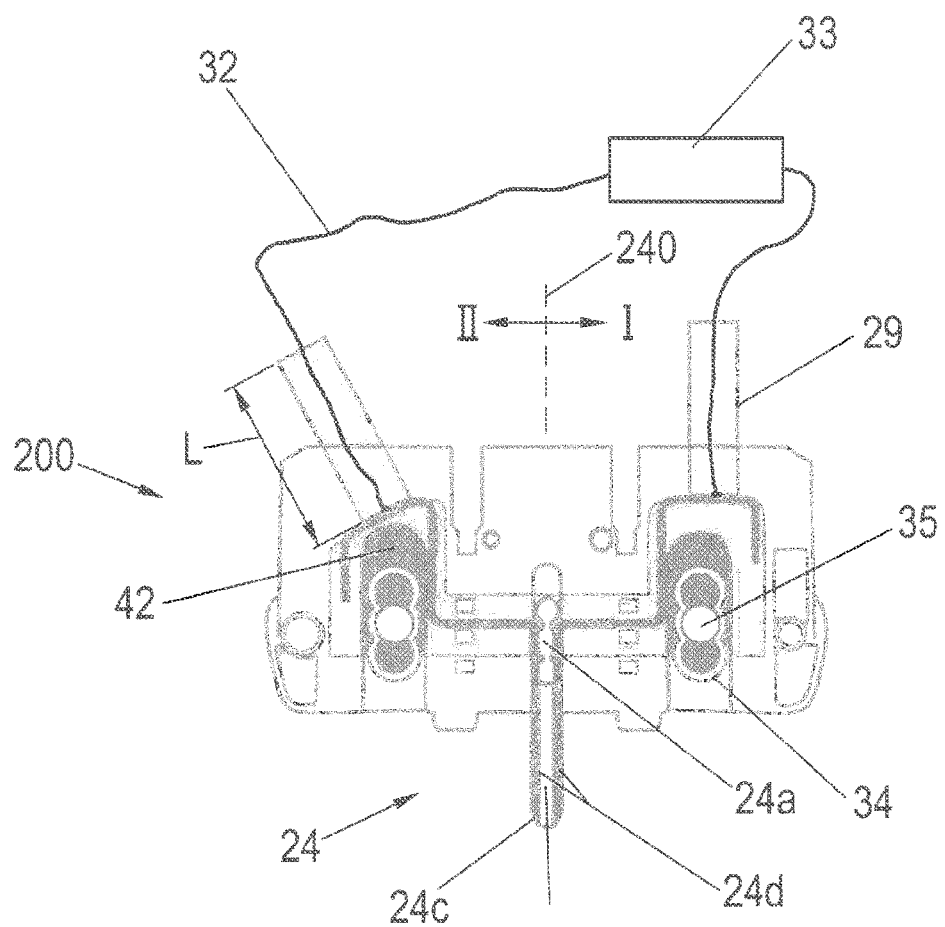
FIG. 9b is a schematic diagram of the electrical testing circuit of the invention.

In FIG. 9a, a testing device 2 according to the present invention includes a testing unit 200 comprising a housing containing a chamber in which is mounted a connection device 42. The connection device 42 (best shown in FIG. 10d) comprises an elongated body member having a center portion provided with a downwardly extending integral measuring tab portion 24, and two end portions provided with upwardly extending integral measurement portions 29. Thus, the measurement portions 29 are arranged on the opposite side of the connection unit 42 from the measuring tab portion 24. On the tab portion 24 are mounted a pair of contact plates 24d (see FIG. 9b) are provided for electrically engaging the leaf spring contact tips 15a, 16a of the terminal block assembly 3 (see FIG. 1, for example). This connection is symmetrical with respect to an imaginary center plane 240 dividing the measuring tab 24 in half, so that one of the contact plates 24d is arranged on a first side 1, and the other contact plate 24d is arranged on a second side II of the center plane 240 opposite (i.e., opposite from the first side).

As shown in FIG. 9b, the contact plates 24d are each connected to a socket contact of one of the two first measurement connector portions 29 in an electrically conducting manner by a busbar section. At the time of the insertion of the testing device 2 into a terminal block assembly 3, each of the contact plates 24d is connected in an electrically conducting manner to a contact tab 15a, 16a (or 17a, 18a) of a contact tab pair 15a, 16a (or 17a, 18a) arranged on the top side or on the bottom side of the terminal block assembly 3. As a result, in each case a first measurement connection 29 of the connection unit 42 is connected in an electrically conducting manner to a contact tip 15a, 16a, 17a, 18a of the terminal block assembly 3.

FIG. 9a shows that the first measurement connections 29 of the testing unit 200 are arranged at an angle 44 with respect to one another. The angle 44 which the measurement connections form with respect to one another is selected here in a fixed manner and it is not adjustable. In principle, it is, however, also possible to produce a testing unit 200 with adjustment means (not shown), which allow an adjustment of the angle 44 which the first measurement connections 29 of the same testing unit 200 form with respect to one another.

The first measurement connections 29 in each case have a free measurement socket connection end 291 into each of which a measurement head 37 (see FIG. 9d) can be inserted. If the same first measurement connections 29 are used for the same testing unit 200, the angle 44 formed between the first measurement connections 29 results in a first vertical offset 46a of their first measurement connection ends 291 relative to one another.

In addition, due to the angle 44, a distance 60 of the first measurement connection 29 arranged on the first side I of the testing unit 200 is not equal to a distance 61 of the second measurement connection arranged on the second side II of the testing unit 200, so that the angle 44 results in a distance difference 600 of the measurement connection ends 291 of the same testing unit 200 with respect to the center plane 240.

In addition, the connection unit 42 is arranged within the testing unit 200 in a height-adjustable manner. For this purpose, the connection unit 42 comprises a detent slot securing means 34 (i.e., a detent recess) into which extends a fixed securing pin 35 that is connected in a fixed position with the housing 23 of the testing device 200. The detent recess 34 comprises three sections 344 corresponding to the cross section of the fixed pin 35, which are configured in such a manner that the connection unit 42 is height adjustable in a total of three levels 47, 48, 49 relative to the housing 23 of the testing unit 200. The three levels 47, 48, 49 are shown here relative to a housing top side 231.

As a result of the height adjustment of the connection unit 42, the first measurement connections 29 arranged on the connection unit 42 are height adjustable. In the embodiment of FIG. 9a shown here, the height adjustment of the connection unit 42 is possible in the context of the installation of the testing unit 200. However, in principle an embodiment of a testing unit 200 is also conceivable which includes adjustment means (not shown) by means of which the connection unit 42 and thus also the first measurement connections 29 are still adjustable after the installation of the testing unit 200.

The height adjustment of the connection unit 42 has the effect that the measurement connection ends 291 of the first measurement connections 29 arranged on the same side I, II of different testing units 200, which are arranged at the same angle 44, have a second vertical offset 46b, 46b' relative to one another.

The testing device 2 of the embodiment of FIG. 9a comprises at least four testing units 200 arranged one after the other. In the embodiment example shown here, one of the first measurement connections 29 of each testing unit 200 is always arranged parallel to the center plane 240, so that the other of the two first measurement connections 29 is arranged at the angle 44 with respect to the center plane 240. Here, of the four testing units 200 represented, in each case two are arranged at the same level 47, 48, 49 relative to the housing 23, but rotated by a rotation angle of 180° with respect to one another. Instead of a rotation of a testing unit 200 by the rotation angle of 180°, a rotation of the connecting unit 42 in the housing 23 of the testing unit 200 is possible.

By rotating the connection unit 42 or the testing unit 200, first measurement connections 29, on the same side I, II relative to the center plane 240, which are arranged at the angle 44 with respect to the center plane 240, alternate with first measurement connections 29 which are arranged parallel to the center plane 240. Since the measurement connection ends 291 of the first measurement connections 29 which are arranged parallel to the center plane 240 are at a first distance 60 from the center plane 240, and since the measurement connection ends 291 of the first measurement connections 29 which are arranged at the angle 44 with respect to the center plane 240 have a second distance 61 from the central plane 240, the measurement connection ends 291 of the different testing units 200 also have the distance difference 600 with respect to one another.

Here, the measurement connection ends 291 of the first measurement connections 29 of the same level 47, 48, 49, which are arranged on the same side I, II of the center plane 240 at the angle 44 with respect to one another, have the same first vertical offset 46a as that which the measurement connection ends 291 of the first measurement connections 29 of the same testing unit 200 have relative to one another. Since the measurement connection ends 29 of first measurement connections 29 of different testing units 200, which are arranged at the same angle 44 on the same side I, II, have a second vertical offset 46b, 46b' relative to one another, the measurement connection ends 291 arranged on the same side I, II here have in total four height distances 451, 452, 453, 454 with respect to the housing top side 231. Using the same first measurement connections 29, as a result of the one angle 44, it is therefore possible to achieve, for each side I, II of the center plane 240, the height adjustment in three levels 47, 48, 49, and the rotation of the testing units 200 by the rotation angle of 180° with a total of six height distances 451-454 of the measurement connection ends 291.

The measurement connection ends 291 can therefore be arranged in a total of six different positions, which differ in terms of their height distance 451-454 from the housing top side 231 and possibly in terms of their distance 60, 61 from the center plane 240. As a result, a free space between the measurement connection ends 291 is greater than in the case of measurement connection ends 291 that are arranged at the same height distance 451-454 from the housing top side 231, and that have the same distance 60, 61 from the center plane 240. The testing unit 200 can therefore either be constructed in a more compact manner, or larger measurement heads 37 can be used.

For each one of the first measurement connections 29, each testing unit 200 moreover comprises a second measurement connection 30, which is arranged on the side of the testing device 2. The second measurement connection 30 is connected in each case in an electrically conducting manner to the first measurement connections 29 associated with it. In addition, the former is arranged here in each case at a right angle to the latter. Therefore, the second measurement connections 30 of a testing unit 200 here also in each case are at the angle 44 relative to one another. In addition, at the time of the height adjustment of the connection unit 42, they are height adjusted. As a result, it is also possible to achieve for the second measurement connections 30 in each case six height distances (not shown) from the housing top side 231.

The height adjustment of the connection unit 42 relative to the housing 23 in addition has the effect that the pin element 24 is also height adjusted. As a result, contact tab pairs 15a-18a of the connection device 3 can be interrupted in a targeted manner temporally with respect to one another by means of mutually vertically offset pin elements 24 of different testing units 200.

FIG. 9b shows a section through a single testing unit 200 in a diagrammatic representation. Here one can see primarily the contact plates 24d arranged on the pin element 24 and in each case their electrically conducting connection with the first measurement connection 29. The first measurement connections 29 are connected via an electrically conducting connection 32 to a testing means 33. The testing means 33 is, for example, a conventional measurement meter, such as, for example, a voltage meter, a current meter, a frequency meter, a power and/or resistance meter. A complex testing circuit can also be considered as testing means 33.

FIG. 9c shows an additional embodiment of a testing device 2 according to the invention from above. The testing device 2 differs from the testing device of FIG. 9a in the height of the selected connection units 42 of the testing units 200. Here one can see primarily the distance difference 600 of first measurement connections 29 from the center plane 240.

FIG. 9d shows a diagrammatic view of the testing device 2 from the side. In some of the first measurement connections 29, measurement heads 37 are arranged. Suitable measurement heads 37 are, for example, conventional probe heads or banana plugs. In addition, some of the second measurement connections 30 are electrically connected with cables 36. For the connection of the second measurement connection 30 to the cables 36, a ring type cable lug 36a and a fork type cable lug 36b are shown here as connection means examples.

Figure 9F:
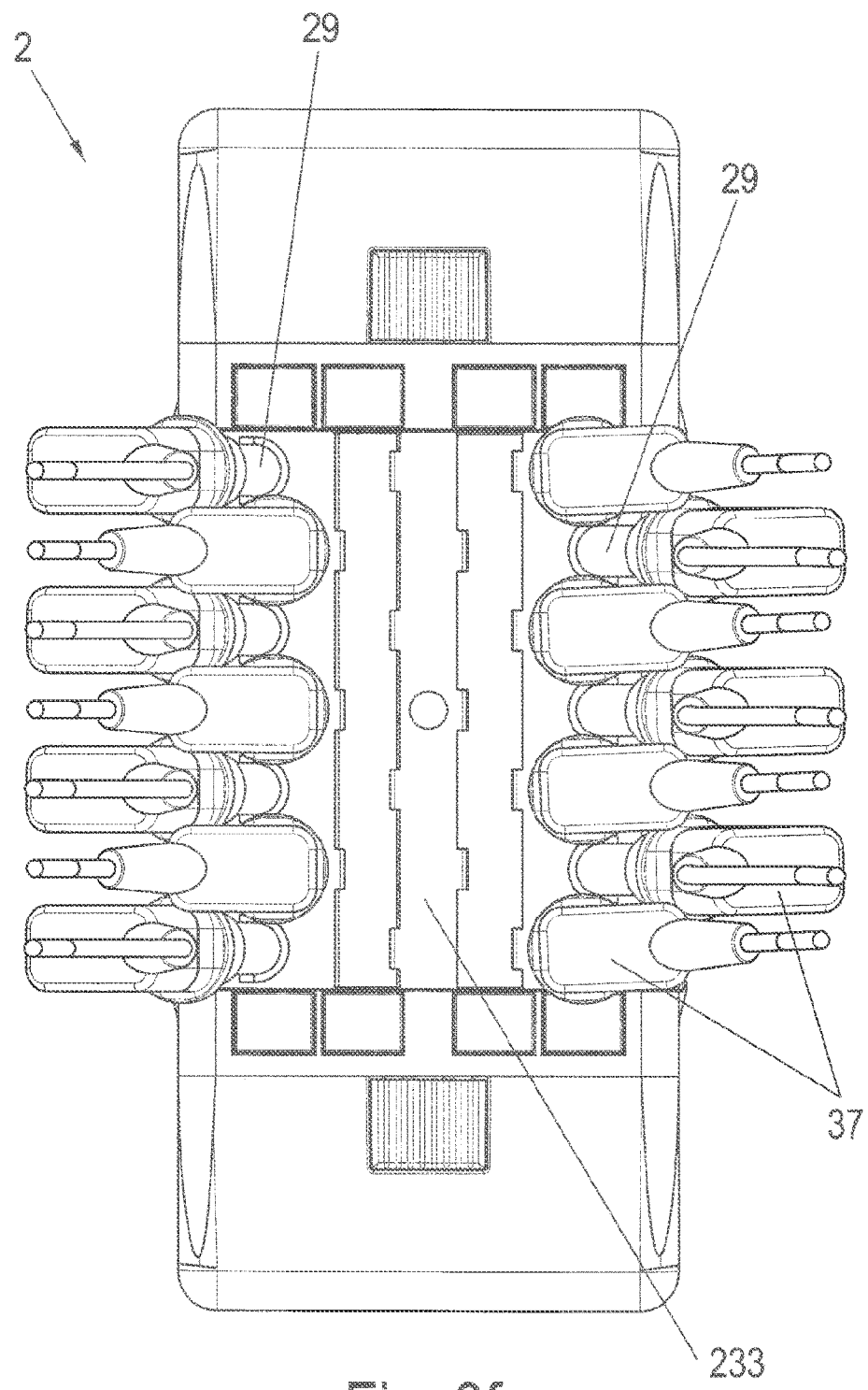

FIG. 9e shows a perspective view of the testing device 2 of FIG. 9c. In the first measurement connections 29 of the testing device 2, probe heads 37 are arranged here. In this testing device 2, the connection units 42 which are arranged one after the other (see FIG. 9a) are in each case rotated with respect to one another by the rotation angle of 180°. As a result, a first measurement connection 29 arranged parallel to the center plane 240 (see FIG. 9a) always alternates with a first measurement connection 29 arranged at the angle 44 (see FIG. 9a) with respect to the center plane 240. This allows an unproblematic arrangement of relatively large probe heads 37. This is also illustrated in FIG. 9f, which also shows the testing device 2 of FIG. 9c from above, but with the probe heads 37 inserted.

FIGS. 9a-10d illustrate testing devices 2, 2', 2" with testing units 200 each with two identical first measurement connections 29 arranged at the angle 44 relative to one another. However, it is also conceivable to use testing devices 2 with different first measurement connections 29, in particular with first measurement connections 29 of different length L (see FIG. 9b). Therefore, in the context of the invention, a vertical offset of the first measurement connections 29 with respect to one another should be understood as a vertical offset 46a, 46b, 46b' of the free measurement connection ends 291 with respect to one another.

In addition, the figures show testing devices 2, 2', 2" with several testing units 200, wherein the first measurement connections 29 of the different testing units 200 have the same angle 44 with respect to one another. However, the invention also relates to testing devices 2, 2', 2" with testing units 200 whose first measurement connections 29 have different angles 44 with respect to one another.

Analogously to the optional connection of the clamping devices 5, 7 of the connection device 2 (see FIG. 4b), the possibility also exists optionally for the testing device 3 to connect the first measurement connections 29 of a testing unit 200 or the first measurement connections 29 of different testing units 200 electrically to each other by means of a cross connector 70 (FIG. 9g). In the case of the testing device 2 as well, the cross connectors 70 are inaccessibly covered in the delivered state by a protective cover plate 233 (see FIG. 9f). FIG. 9g shows an assembly situation with some testing devices 2 already inserted and some cross connectors 70 that are not yet inserted.

In FIG. 10, an additional embodiment of a testing device 2' according to the invention is formed by joining, here by screw connection 43a, individual testing units 200. FIG. 10a shows the testing units 200 or the testing device 2' from above. The testing units 200 each have their own housing 23'. They each have on one side I, II the first measurement connection 29 arranged parallel to the center plane 240 and on the other side I, II the first measurement connection 29 arranged at the angle 44 (see FIG. 9a) with respect to the center plane 240. One of the testing units 200 is in addition rotated by the rotation angle of 180° relative to the other testing units 200. In this FIG. 10a, the distance difference 600 of the measurement connection ends 291 (see FIG. 9a) from the center plane 240 is visible in particular.

Figure 10B:
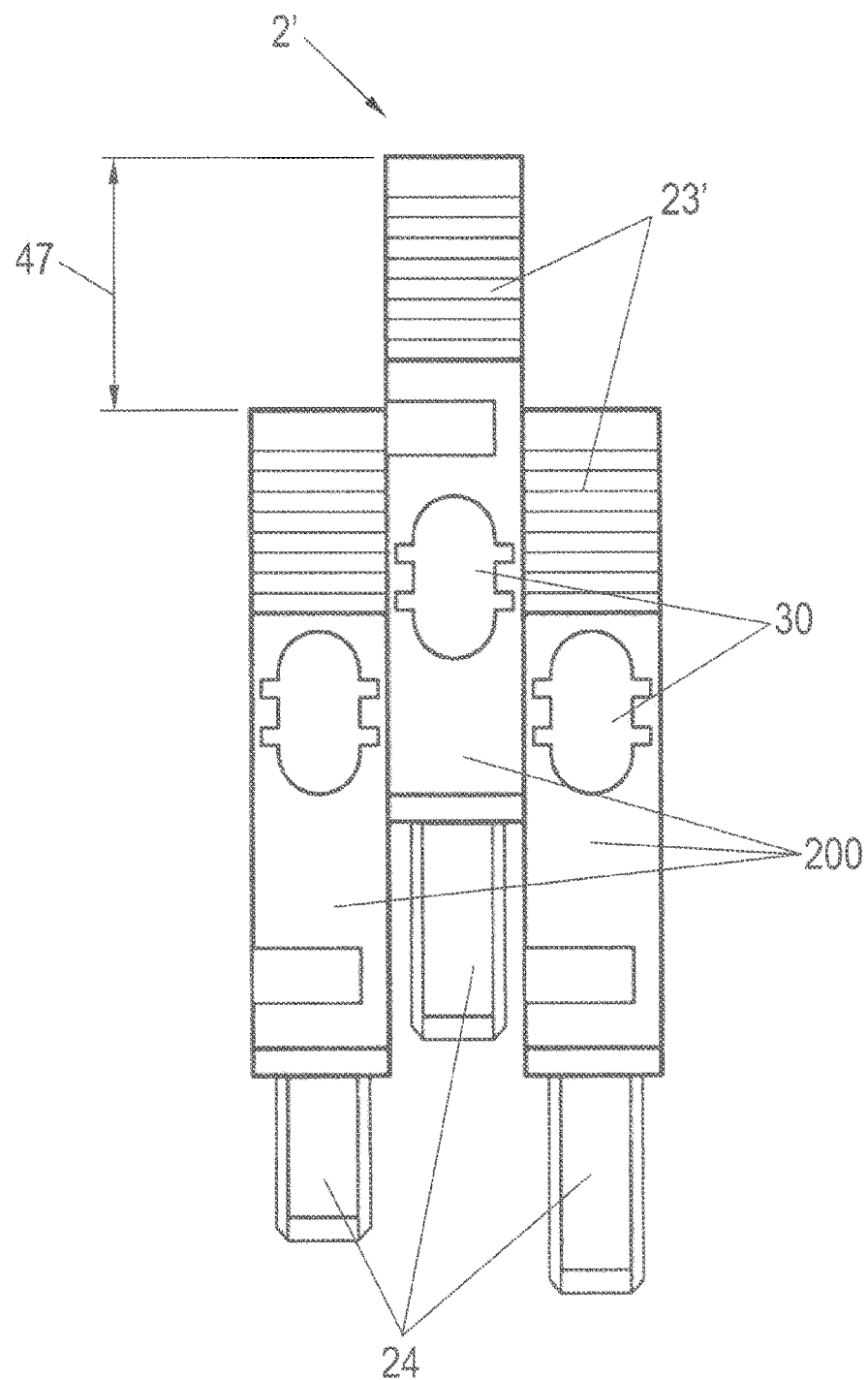

In FIG. 10b, a testing device 2' of the same type as in FIG. 10a is shown from the side. The testing devices 2' differ in the number of their testing units 200. One can see here that the vertical offset between the first measurement connections 29 is achieved by a height difference 47 between the testing units 200.

Figure 10C:
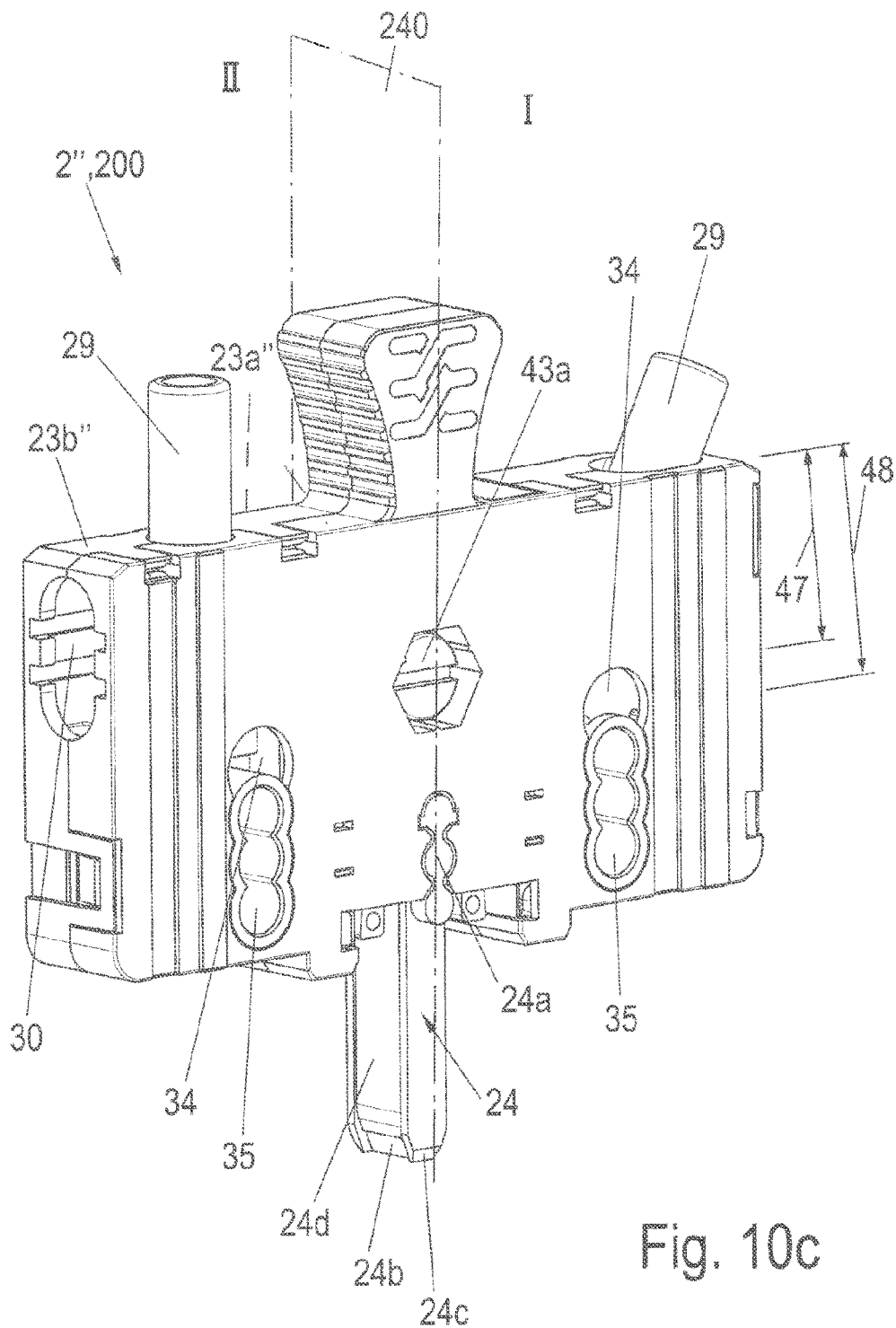

FIGS. 10c and 10d show an additional embodiment of a testing device 2". The testing device 2" comprises only one testing unit 200. The testing unit 200 comprises two housing portions 23a", 23b" which are connected to each other in a detachable manner. A screw 43a is provided here for the connection.

In the housing 23a", 23b" of the testing unit 200, a connection unit 42 is provided, which is height adjustable here at two levels 47, 48. On the connection unit 42, the pin element 24 with the two contact plates 24d and the two first measurement connections 29 arranged at the angle 44 with respect to one another are provided.

In addition, the second measurement connections 30, which are connected in an electrically conducting manner to the first measurement connections 29 and arranged in each case at a right angle relative to said first measurement connections, are shown.

Figure 11C:
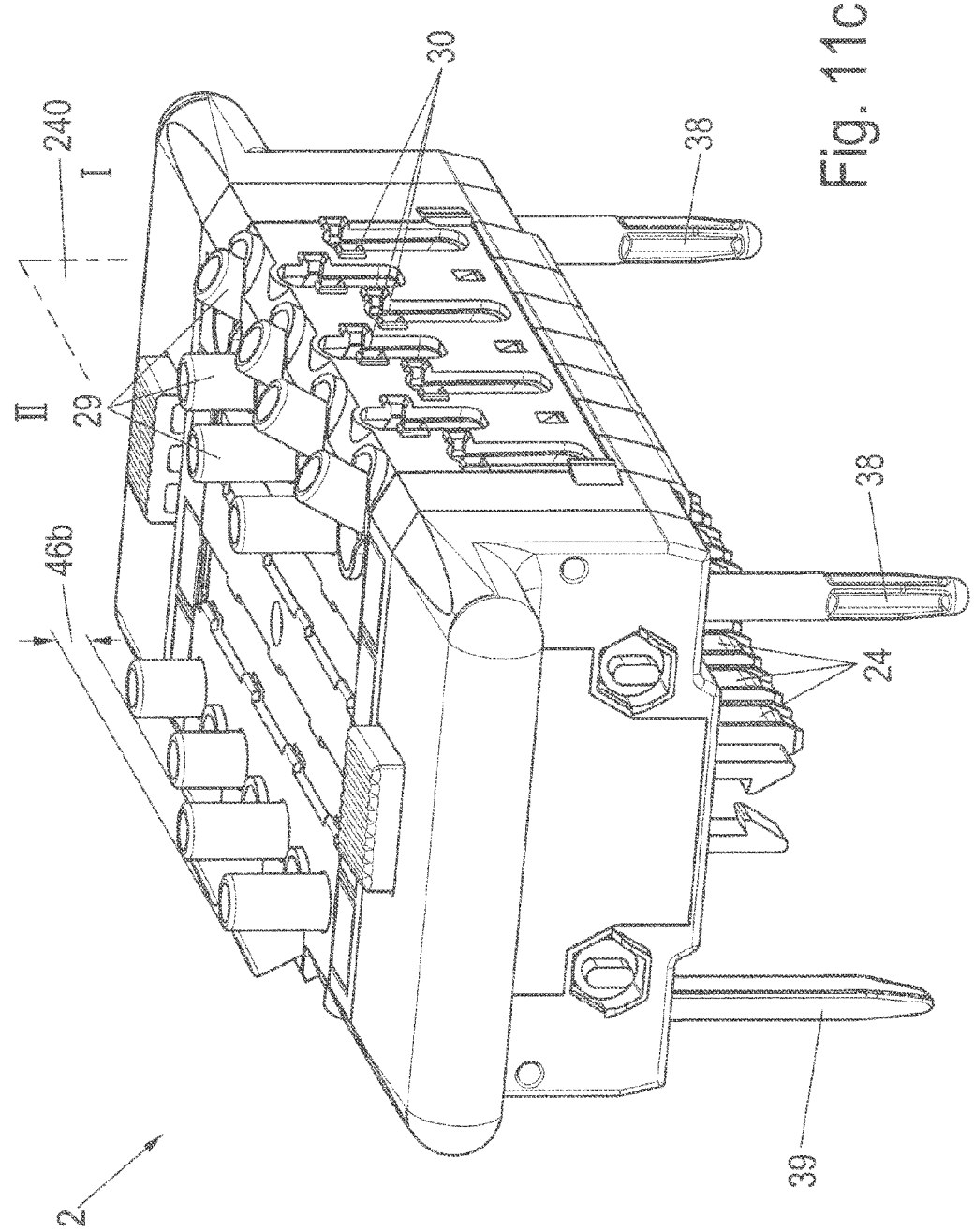
FIG. 11c is a perspective view of a similar assembled testing arrangement.

FIGS. 11a-11c show an additional embodiment, wherein the testing device 2 comprises seven testing units 200, which are arranged relative to the housing top side 231 at two different levels 47, 48, 49 (see FIG. 9a). Here, however, four testing units arranged one after the other or three testing units arranged one after the other are provided without mutual vertical offset. However, the testing units are rotated by the rotation angle of 180° with respect to one another.

In FIG. 11a one can see primarily that the second vertical offset 46b, 46b' which exists between the measurement connections 291 of the first measurement connections 29 of different testing units 200 of the same side I, II of the center plane 240 (see FIG. 11c) also exists between the pin elements 24.

FIGS. 12a-12c illustrate in each case a section through a testing unit 200 with a three-step level adjustable connection unit 42. At the time of the height adjustment of the connection unit 42 from one level to the next level 47, 48, 49 (see FIG. 9a), not only the first measurement connections 29 are adjusted by the second vertical offset 46b, 46b', but so is the pin element 24.

While in accordance with the provisions of the Patent Statutes the preferred forms and embodiments of the invention have been illustrated and described, it will be apparent to those skilled in the art that changes may be made without deviating from the invention described above.

What is claimed is:

1. A testing arrangement for testing the electrical circuits of a terminal block assembly (3), comprising at least one testing unit (200) including:
   (a) a generally rectangular testing unit housing (23) formed of insulating material, said housing including vertical pairs of side and end walls, and horizontal top and bottom walls, said walls defining a chamber contained within said housing;
   (b) at least one connection device (42) mounted in said housing chamber, said connection device including:
      (1) an elongated connector body formed of insulating material and having center and end portions, said connector body including:
         (a) an integral measuring tab portion (24) extending downwardly from said connector body center portion, and outwardly from said testing unit housing via an opening contained in said housing bottom wall, said tab portion being adapted for insertion into a testing opening contained in the terminal block assembly;
         (b) a pair of coplanar measurement portions (29) extending upwardly from said connector body end portions, respectively, via corresponding openings contained in said testing unit housing; and
      (2) a testing circuit at least partially mounted on said connection device, said testing circuit including:
         (a) an electrical testing component (33) having a pair of end terminals;
         (b) a pair of input conductive contact plates (24c, 24d) mounted on opposite sides of said measuring tab portion for connection with the terminals of an electrical circuit of said terminal block assembly that is to be tested; and
         (c) a pair of conductive connecting paths connecting said contact plates with said testing component end terminals, respectively, each of said conductive arrangements including a bus bar section arranged within said elongated connector body, and a contact carried by an associated one of said measurement portions;
   (c) said measurement portions terminating in upper tip portions (291) that are at different elevations relative to each other, thereby to afford a compact assembly of said testing arrangement.

2. A testing arrangement as defined in claim 1, wherein said connector body measurement portions comprise hollow sockets adapted for connection with probe heads (37), respectively.

3. A testing arrangement as defined in claim 2, wherein said connector body is vertically displaceable to different height levels (47, 48, 49) relative to said housing.

4. A testing arrangement as defined in claim 3, and further including a fixed pin (35) and detent slot (34) arrangement for determining the vertical position of said connector body relative to said housing.

5. A testing arrangement as defined in claim 1, wherein said connector body measurement portions are arranged at an acute angle (44) relative to each other.

6. A testing arrangement as defined in claim 5, wherein a first one of said connector body measurement portions is vertical.

7. A testing arrangement as defined in claim 6, wherein said a second one of said body portions (30) is horizontal and extends through a vertical slot contained in an associated side wall of said housing.

8. A testing arrangement as defined in claim 1, wherein a plurality of said connection devices are arranged in side-by-side relation within said housing chamber.

9. A testing arrangement as defined in claim 1, wherein a plurality of said testing units are arranged in side-by-side relation.

10. A testing arrangement as defined in claim 9, wherein said testing units are arranged in vertically-offset relation.

11. A testing arrangement as defined in claim 9, wherein at least some of said testing units are arranged in successive mirror image vertical-axis 180-degree-rotated relation, thereby to achieve compact assembly of said testing units when measuring probes heads (37) are attached thereto.

12. A testing arrangement as defined in claim 11, wherein said contact plates (24*d*) are arranged on opposite sides of a vertical transverse plane extending through said measuring tab; and further wherein the connector measurement portions of each testing unit area are angularly arranged opposite ends of the associated connection device elongated body to define an angle (44).

13. A testing arrangement as defined in claim 12, wherein the connector portions of each test unit have the same angular relationship.

14. A testing arrangement as defined in claim 13, wherein corresponding connector portions of the test units have the same length.

15. A testing arrangement as defined in claim 11, wherein said measuring tab is adapted for insertion between the leaf spring contacts of an associated terminal block assembly.

\* \* \* \* \*